(12) United States Patent
Murotani et al.

(10) Patent No.: US 7,741,388 B2
(45) Date of Patent: Jun. 22, 2010

(54) EPOXY RESIN COMPOSITION AND SEMICONDUCTOR DEVICE

(75) Inventors: Kazuyoshi Murotani, Tochigi (JP); Ken Ukawa, Tochigi (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 186 days.

(21) Appl. No.: 11/263,822

(22) Filed: Nov. 1, 2005

(65) Prior Publication Data

US 2006/0094797 A1 May 4, 2006

(30) Foreign Application Priority Data

| Nov. 2, 2004 | (JP) | ............................. 2004-318789 |
| Dec. 24, 2004 | (JP) | ............................. 2004-374503 |
| Mar. 30, 2005 | (JP) | ............................. 2005-099391 |

(51) Int. Cl.
*C08G 59/50* (2006.01)
*C08L 63/00* (2006.01)
*H01L 23/29* (2006.01)

(52) U.S. Cl. .................. 523/400; 523/466; 257/793

(58) Field of Classification Search ............... 523/400, 523/466; 257/793
See application file for complete search history.

(56) References Cited

U.S. PATENT DOCUMENTS

| 6,054,222 | A * | 4/2000 | Takami et al. ............... 428/417 |
| 6,562,474 | B1 * | 5/2003 | Yoshimi et al. ........... 428/472.3 |
| 6,753,086 | B2 * | 6/2004 | Nagata et al. ............... 428/413 |
| 7,157,313 | B2 * | 1/2007 | Kuroda ....................... 438/127 |
| 7,354,978 | B2 * | 4/2008 | Nishitani .................... 525/486 |
| 7,431,990 | B2 * | 10/2008 | Kuroda ....................... 428/413 |
| 2003/0152776 | A1 * | 8/2003 | Kiuchi et al. ............... 428/413 |
| 2003/0153650 | A1 * | 8/2003 | Tada et al. .................. 523/400 |
| 2009/0196999 | A1 * | 8/2009 | Egli et al. ................... 427/307 |
| 2009/0326100 | A1 * | 12/2009 | Hamada et al. ............. 523/435 |

FOREIGN PATENT DOCUMENTS

| JP | 01-275618 | 11/1989 |
| JP | 05-097965 | 4/1993 |
| JP | 05-097967 | 4/1993 |
| JP | 05-315472 | 11/1993 |
| JP | 08-258077 | 10/1996 |
| JP | 11-029695 | 2/1999 |
| JP | 11-152393 | 6/1999 |
| JP | 2001-089551 | 4/2001 |
| JP | 2003-252960 | 9/2003 |
| WO | WO 01/17006 | * 3/2001 |
| WO | WO 2004/065486 | * 8/2004 |

* cited by examiner

*Primary Examiner*—Mark Eashoo
*Assistant Examiner*—Megan McCulley
(74) *Attorney, Agent, or Firm*—Smith Gambrell & Russell, LLP

(57) ABSTRACT

The present invention is to provide an epoxy resin composition for encapsulating a semiconductor having a high flame resistance without using a flame retarder and having an excellent solder reflow resistance, and a semiconductor device using the same for encapsulating a semiconductor element. An epoxy resin composition for encapsulating a semiconductor of each of the first, second and third aspects essentially comprises (A) a phenol aralkyl type epoxy resin having a phenylene structure, (B) a phenol aralkyl type phenolic resin having a biphenylene structure and (D) an inorganic filler as common components, wherein (D) the inorganic filler is contained at the rate of 84 wt % or more and 92 wt % or less of the total amount of the epoxy resin composition.

24 Claims, No Drawings

EPOXY RESIN COMPOSITION AND SEMICONDUCTOR DEVICE

BACKGROUND OF THE INVENTION

1. Field of the Invention

The present invention relates to an epoxy resin composition for encapsulating a semiconductor and a semiconductor device using the same.

2. Description of the Related Art

In an electronic device such as a diode, a transistor or an IC (Integrated Circuit), an epoxy resin composition is conventionally used for encapsulating. Particularly, an epoxy resin composition comprising an epoxy resin, a phenolic resin and an inorganic filler such as fused silica or crystalline silica and excellent in heat resistance and moisture resistance is used for the IC. Recently, however, a market trend is inclined to downsizing, weight saving and high-end product of electronics, and thereby a highly integrated semiconductor device is continuously under development. Additionally, a surface mount type semiconductor device is becoming popular more and more. In the circumstances, a demand for the epoxy resin composition for encapsulating a semiconductor element is increasing severe. Particularly, in the circumstance that a surface mount type semiconductor device is becoming general, the semiconductor device which absorbed moisture is subjected to a high temperature environment during a solder reflow treatment. Furthermore, as a part of a zero-emission movement, replacement to a lead-free solder is proceeded. Such a lead-free solder has a higher melting point than that of the conventional solder, and thereby requires a reflow temperature of 260° C., which is 20° C. higher than that of the conventional solder, when mounting on a surface. Thereby, the semiconductor device is subjected to a higher temperature environment than ever, which is apt to cause a defect greatly detracting the reliability of the semiconductor device such as delamination at an interface between a semiconductor element or a lead frame and a cured product of the epoxy resin composition, or a crack in the semiconductor device.

Also, with regard to the lead frame, from the viewpoint of excluding any lead, the number of a semiconductor device in which a preplating frame plated with Ni, Ni—Pd, Ni—Pd—Au or the like in advance is used instead of solder plating on outer lead is increasing. However, such plating has a problem of notably poor adhesion with a cured product of the epoxy resin composition, which may cause delamination at the interface when mounting on a surface. Therefore, there is a demand for preventing such a defect, that is, a demand for an improvement in solder reflow resistance.

On the other hand, from the environmental concerns, there is a movement for restricting a use of a halogen based flame retardant such as a bromine-contained organic compound or the like, and an antimony compound such as diantimony trioxide, diantimony tetraoxide or the like, which are conventionally used as a flame retardant in a encapsulant for the semiconductor. Therefore, there is a demand for a new flame retardant technology for replacing the conventional one. As such a replacing flame retardant technology in a encapsulant for semiconductor, there is proposed a method using a metal hydroxide such as aluminum hydroxide, magnesium hydroxide or the like, which is less harmful to the environment. However, this method has a problem that a large amount of the metal hydroxide is required to obtain an expected flame retardant effect. Additionally, if the compound ratio of the metal hydroxide is increased to obtain a sufficient flame resistance, the flowability and curability of the epoxy resin composition during molding are decreased, and the mechanical strength of the cured product is deteriorated. As a result, the solder reflow resistance is deteriorated in the temperature range of mounting the lead-free solder.

In order to prevent the deterioration of the solder reflow resistance associated with the increase of the mounting temperature, an epoxy resin or a curing agent having a low water absorption rate respectively is used (e.g. Japanese Patent Application Laid-open Nos. Hei 1-275618 (pp. 1 to 5) and Hei 5-097965 (pp. 2 to 6) and Hei 5-097967 (pp. 2 to 7)). However, such an epoxy resin composition does not have a sufficient flame resistance and thereby requires addition of a flame retardant. Additionally, such an epoxy resin composition exhibits a low adhesion to the preplating frame. Thereby, the reliability is low, particularly in a package using such a preplating frame.

Furthermore, such an epoxy resin composition has a low crosslinking density and thereby a molded article immediately after curing is so soft that a problem may arise in a continuous molding process such as an insufficient release of the resin from the mold, which may reduce productivity.

In order to improve productivity, there is proposed a method adding oxidized polyethylene (e.g. Japanese Patent Application Laid-open Nos. Hei 8-258077 (pp. 2 to 9) and Hei 11-152393 (pp. 2 to 5)). However, it is required to increase a compounding amount of oxidized polyethylene in order to obtain sufficient releasing property owing to oxidized polyethylene only. In this case, the adhesion is deteriorated. Furthermore, in order to improve the dispersibility of oxidized polyethylene, there is proposed a method using epoxy polyether silicone having dimethyl siloxane structure as a main chain together (e.g. Japanese Patent Application Laid-open No. Hei 5-315472 (pp. 2 to 7)). Although a silicone oil having a polyether chain greatly contributes to improvement of productivity, the solder reflow resistance is deteriorated because of increased moisture absorption due to the polyether chain.

In order to improve the solder reflow resistance, there is also proposed a method using a resin having flexibility and flame resistance in addition to a low water absorption property (e.g. Japanese Patent Application Laid-open Nos. Hei 1-275618 (pp. 1 to 5), Hei 5-097965 (pp. 2 to 6) and Hei 5-097967 (pp. 2 to 7)). However, if a compounding ratio of an inorganic filler is increased in order to apply for a case of using a lead-free solder, a sufficient flowability cannot be obtained, which prevents the realization of this method.

In circumstances as described above, there is a demand for developing a resin composition for encapsulating a semiconductor device having a high flame resistance without addition of any flame retardant, and having a high solder reflow resistance which is applicable to a lead-free solder without declining flowability.

SUMMARY OF THE INVENTION

The present invention has been achieved in light of the above-stated conventional problems. A first object of the present invention is to provide an epoxy resin composition for encapsulating a semiconductor having a high flame resistance without using a flame retarder, having an excellent solder reflow resistance and which can be used for a lead-free solder, and a semiconductor device using the same for encapsulating a semiconductor element.

A second object of the present invention is, in addition to attaining the above-stated first object, to provide an epoxy resin composition for encapsulating a semiconductor further having an excellent productivity, and a semiconductor device using the same for encapsulating a semiconductor element.

A third object of the present invention is, in addition to attaining the above-stated first object, to provide an epoxy resin composition for encapsulating a semiconductor having an excellent flowability, and a semiconductor device using the same for encapsulating a semiconductor element having a high reliability.

The present invention provides the following first, second and third aspects in order to attain the above-stated first object. In the aspects, the second aspect can attain the second object in addition to the first object. The third aspect can attain the third object in addition to the first object.

An invention according to the first aspect of the present invention provides the following epoxy resin composition for encapsulating a semiconductor and a semiconductor device.

[1] An epoxy resin composition for encapsulating a semiconductor essentially comprising (A) an epoxy resin represented by the following formula (1), (B) a phenolic resin represented by the following formula (2), (C) a curing accelerator, (D) an inorganic filler and (E) a triazole compound, wherein (D) the inorganic filler is contained at the rate of 84 wt % or more and 92 wt % or less of the total amount of the epoxy resin composition:

Formula (1)

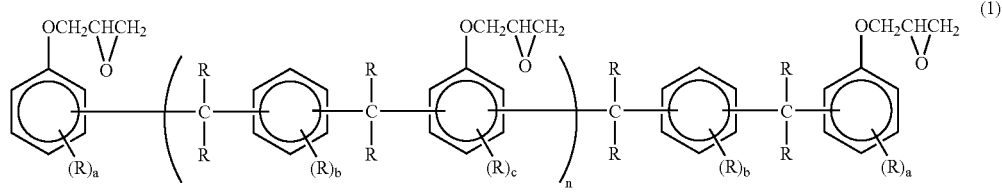

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less;

Formula (2)

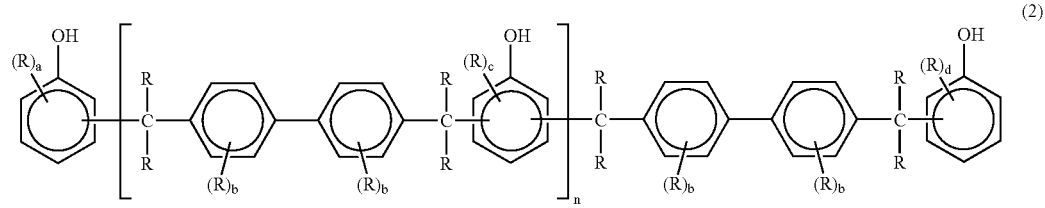

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less.

[2] An epoxy resin composition for encapsulating a semiconductor of the first aspect, wherein a softening point of (A) the epoxy resin represented by formula (1) is 35° C. or more and 60° C. or less.

[3] An epoxy resin composition for encapsulating a semiconductor of the first aspect, wherein (E) the triazole compound is a compound having a 1,2,4-triazole ring.

[4] An epoxy resin composition for encapsulating a semiconductor of the first aspect, wherein (E) the triazole compound is a compound represented by the following formula (3):

Formula (3)

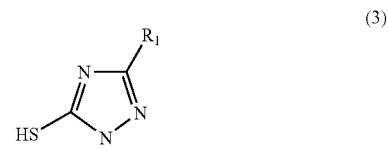

wherein $R_1$ is a hydrogen atom, or a functional group selected from the group consisting of a mercapto group, an amino group and a hydroxyl group, or a hydrocarbon chain having 1 to 5 carbons to which any one of the functional groups is added.

[5] An epoxy resin composition for encapsulating a semiconductor of the first aspect, wherein a resin obtained by preliminary melting and mixing (A) the epoxy resin represented by the formula (1) and (B) the phenolic resin represented by the formula (2) is used.

[6] A semiconductor device, wherein a semiconductor element is encapsulated with the epoxy resin composition for encapsulating a semiconductor of the first aspect.

An invention according to the second aspect of the present invention provides the following epoxy resin composition for encapsulating a semiconductor and a semiconductor device.

[7] An epoxy resin composition for encapsulating a semiconductor essentially comprising (A) an epoxy resin represented by the following formula (1), (B) a phenolic resin represented by the following formula (2), (F) organopolysiloxane having a carboxyl group, (G) oxidized polyethylene and (D) an inorganic filler, wherein (D) the inorganic filler is contained at the rate of 84 wt % or more and 92 wt % or less of the total amount of the epoxy resin composition:

Formula (1)

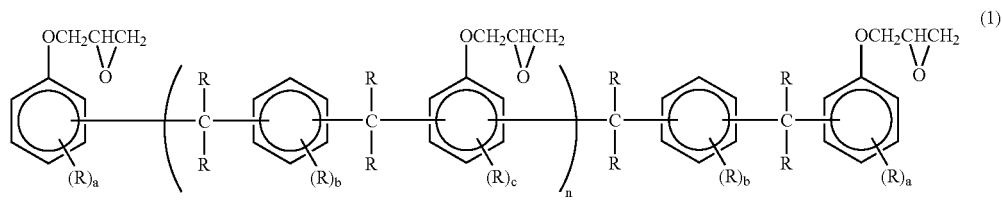

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less;

Formula (2)

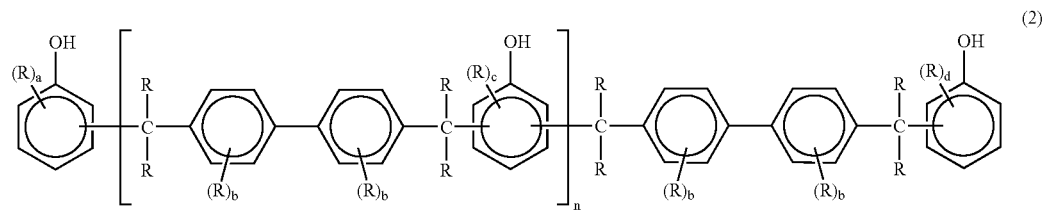

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less.

[8] An epoxy resin composition for encapsulating a semiconductor of the second aspect, wherein a softening point of (A) the epoxy resin represented by the formula (1) is 35° C. or more and 60° C. or less.

[9] An epoxy resin composition for encapsulating a semiconductor of the second aspect, wherein (F) the organopolysiloxane having a carboxyl group is organopolysiloxane represented by the following formula (4):

Formula (4)

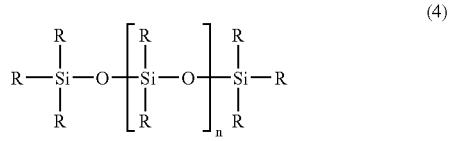

wherein at least one or more of R is an organic group having 1 to 40 carbons and having a carboxyl group and the other group of R is a group selected from the group consisting of hydrogen, a phenyl group and a methyl group, which may be the same or different from each other; and "n" is a mean value and a positive number of 1 to 50.

[10] An epoxy resin composition for encapsulating a semiconductor of the second aspect, wherein (G) oxidized polyethylene is obtained by oxidizing high density polyethylene.

[11] An epoxy resin composition for encapsulating a semiconductor of the second aspect, wherein (G) oxidized polyethylene has a maximum particle diameter of 150 μm or less, and a mean particle diameter of 0.1 μm or more and 100 μm or less.

[12] An epoxy resin composition for encapsulating a semiconductor of the second aspect, wherein (G) oxidized polyethylene has a dropping point of 100° C. or more and 130° C. or less.

[13] An epoxy resin composition for encapsulating a semiconductor of the second aspect, wherein organopolysiloxane having a carboxyl group which is preliminarily reacted with the epoxy resin and a curing accelerator is contained as (F) organopolysiloxane having a carboxyl group.

[14] An epoxy resin composition for encapsulating a semiconductor of the second aspect, wherein a weight ratio (F)/(G) of (F) organopolysiloxane having a carboxyl group and (G) oxidized polyethylene is 5/1 to 1/5.

[15] An epoxy resin composition for encapsulating a semiconductor of the second aspect, further comprising (E) a triazole compound.

[16] An epoxy resin composition for encapsulating a semiconductor of the second aspect, wherein (E) the triazole compound is a compound having a 1,2,4-triazole ring.

[17] An epoxy resin composition for encapsulating a semiconductor of the second aspect, wherein (E) the triazole compound is a compound represented by the following formula (3):

Formula (3)

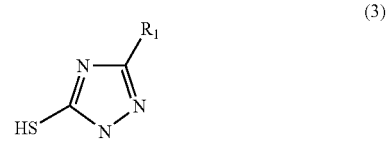

wherein $R_1$ is a hydrogen atom, or a functional group selected from the group consisting of a mercapto group, an amino group and a hydroxyl group, or a hydrocarbon chain having 1 to 5 carbons to which any one of the functional groups is added.

[18] An epoxy resin composition for encapsulating a semiconductor of the second aspect, wherein a resin obtained by preliminary melting and mixing (A) the epoxy resin represented by the formula (1) and (B) the phenolic resin represented by the formula (2) is used.

[19] A semiconductor device, wherein a semiconductor element is encapsulated with the epoxy resin composition for encapsulating a semiconductor of the second aspect.

An invention according to the third aspect of the present invention provides the following epoxy resin composition for encapsulating a semiconductor and a semiconductor device.

[20] An epoxy resin composition for encapsulating a semiconductor essentially comprising (A) an epoxy resin represented by the following formula (1), (B) a phenolic resin represented by the following formula (2), (H) a curing accelerator represented by the following formula (5), (I) a silane coupling agent and (D) an inorganic filler, wherein (H) the curing accelerator represented by the formula (5) is contained at the rate of 0.05 wt % or more and 0.5 wt % or less and (D) the inorganic filler is contained at the rate of 84 wt % or more and 92 wt % or less of the total amount of the epoxy resin composition:

Formula (1)

Formula (5)

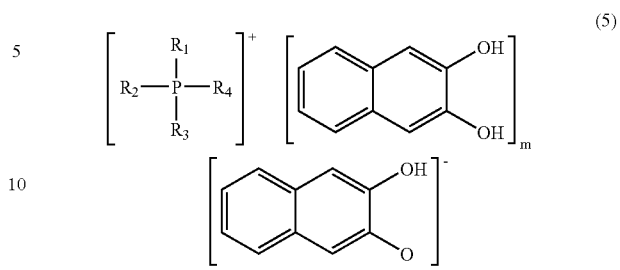

wherein P is a phosphorus atom; each of $R_1$ to $R_4$ is an organic group having 6 to 20 carbons containing an aromatic ring or an aliphatic hydrocarbon group having 1 to 20 carbons, which may be the same or different from each other; and "m" is a number of $0 \leq m \leq 2$.

[21] An epoxy resin composition for encapsulating a semiconductor of the third aspect, wherein a softening point of (A) the epoxy resin represented by formula (1) is 35° C. or more and 60° C. or less.

[22] A semiconductor device, wherein a semiconductor element is encapsulated with the epoxy resin composition for encapsulating a semiconductor of the third aspect.

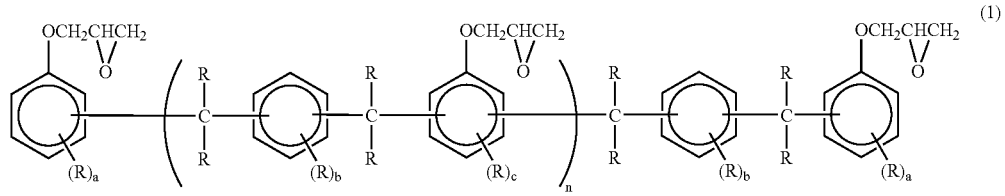

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less;

Formula (2)

According to the first aspect of the present invention, the epoxy resin composition for encapsulating a semiconductor which has a flame resistance grade of V-0 of UL-94 without using a halogen based flame retardant, an antimony compound or other flame retarders, is excellent in adhesion with

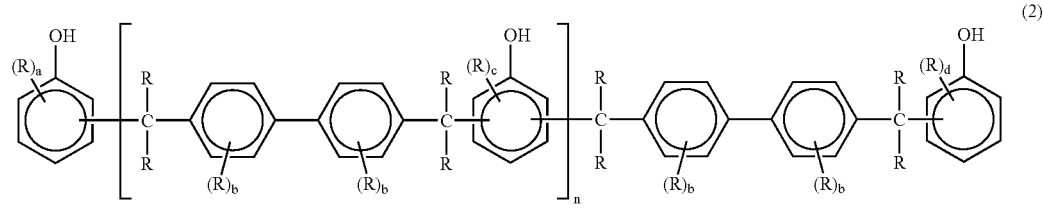

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less.

various substrates such as a semiconductor element, a lead frame or the like, particularly an adhesion with a preplating frame of Ni, Ni—Pd, Ni—Pd—Au or the like, and has an excellent solder reflow resistance to the extent that crack or delamination with the substrate does not occur in a semiconductor device upon solder processing after absorption of moisture, and a semiconductor device wherein a semiconductor element is encapsulated with the use of the epoxy resin composition can be obtained.

According to the second aspect of the present invention, the epoxy resin composition for encapsulating a semiconductor which has a flame resistance grade of V-0 of UL-94 without using a halogen based flame retardant, an antimony compound or other flame retarders, is excellent in adhesion with various substrates such as a semiconductor element, a lead frame or the like, particularly an adhesion with a preplating frame of Ni, Ni—Pd, Ni—Pd—Au or the like by adding a triazole compound to the epoxy resin composition, has an excellent solder reflow resistance to the extent that crack or delamination with the substrate does not occur in a semiconductor device upon solder processing after absorption of moisture, and further can solve problems of releasing property, continuous moldability, appearance of a molded article and soling of a mold or the like, and a semiconductor device wherein a semiconductor element is encapsulated with the use of the epoxy resin composition can be obtained.

According to the third aspect of the present invention, the epoxy resin composition for encapsulating a semiconductor which has a flame resistance grade of V-0 of UL-94 without using a halogen based flame retardant, an antimony compound or other flame retarders, and has high solder reflow resistance which can be used for a lead-free solder without declining flowability, and a semiconductor device which having high reliability wherein a semiconductor element is encapsulated with the use of the epoxy resin composition can be obtained with high productivity.

Therefore, the epoxy resin composition for encapsulating a semiconductor provided by the first, second and third aspects of the present invention can be suitably used for an industrial production of a resin encapsulating type semiconductor device, particularly, a resin encapsulating type semiconductor device of a surface mount type using a lead-free solder.

DETAILED DESCRIPTION OF THE INVENTION

Hereinafter, the first, second and third aspects of the present invention will be successively explained.

First Aspect

The first aspect of the present invention provides an epoxy resin composition for encapsulating a semiconductor essentially comprising (A) a phenol aralkyl type epoxy resin having a phenylene structure represented by the formula (1), (B) a phenol aralkyl type phenolic resin having a biphenylene structure represented by the formula (2), (C) a curing accelerator, (D) an inorganic filler and (E) a triazole compound, wherein (D) the inorganic filler is contained at the rate of 84 wt % or more and 92 wt % or less of the total amount of the epoxy resin composition, thereby, the epoxy resin composition for encapsulating a semiconductor has a flame resistance grade of V-0 of UL-94 without using a halogen based flame retardant, an antimony compound or other flame retarders, and has an excellent solder reflow resistance.

Hereinafter, each component will be explained in more detail.

The epoxy resin represented by the following formula (1) used for the present invention has a hydrophobic resin structure, thus produces a cured product having low moisture absorptivity. In addition, since distance between crosslinking points in the cured product becomes longer, elastic modulus at solder reflow temperature is low. Thereby, the epoxy resin has low stress being generated and is excellent in adhesion, thus has excellent solder reflow resistance and is preferable. Further, the epoxy resin has a high aromatic ring containing rate in the resin structure, hence, the resin itself has a high flame resistance.

R of the formula (1) is hydrogen or an alkyl group having 1 to 4 carbons, which may be the same or different from each other. "a" is an integer of 0 to 4. "b" is an integer of 01 to 4. "c" is an integer of 0 to 3. "d" is an integer of 0 to 4. "n" is a mean value and 0 or a positive number of 10 or less. Among them, a resin represented by the following formula (1a) and the like is preferable from the viewpoint of curability. It is not preferable for "n" to exceed the upper limit since viscosity of the resin increases and the resin composition is inferior in flowability upon molding, thus, increase in the filling amount of the inorganic filler for attaining much lower moisture absorption becomes difficult.

Formula (1)

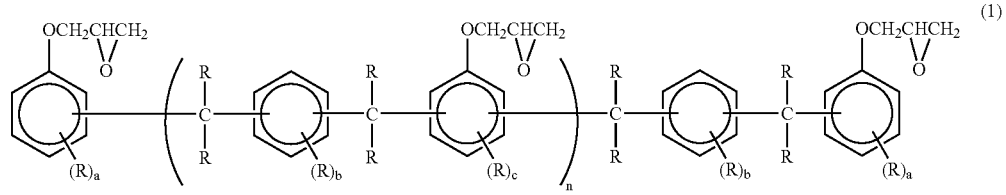

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less;

Formula (1a)

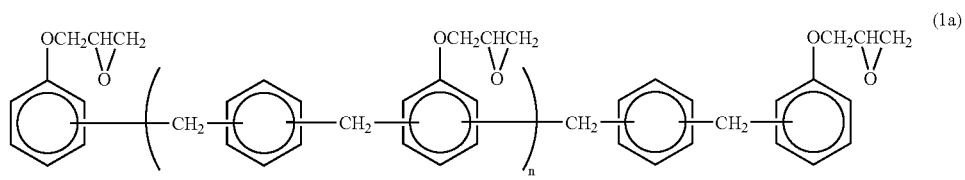

wherein "n" is a mean value and 0 or a positive number of 10 or less.

In the present invention, other epoxy resin may be used together as long as the features obtainable by using the epoxy resin represented by the formula (1) are not deteriorated. As the epoxy resin which may be used together, there may be a monomer, an oligomer, and a polymer having two or more epoxy groups in one molecule in general, the molecular weight and molecular structure of which may not be particularly limited. For example, there may be a phenol novolak type epoxy resin, an o-cresol novolak type epoxy resin, a naphthol novolak type epoxy resin, a phenol aralkyl type epoxy resin having a biphenylene structure, a naphthol aralkyl type epoxy resin having a phenylene structure, a biphenyl structure or the like, a dicyclopentadiene-modified phenol type epoxy resin, a stilbene type epoxy resin, a triphenolmethane type epoxy resin, an alkyl-modified triphenolmethane type epoxy resin, a triazine ring-containing epoxy resin or the like, one kind of which may be solely used, or two or more kinds of which may be used together.

As a compounding amount when other epoxy resin is used together, it is preferable that the amount of the epoxy resin represented by the formula (1) is 70 to 100 wt % of the total amount of the epoxy resin. If the content of the epoxy resin represented by the formula (1) lowers the lower limit, the moisture absorption rate may increase and the solder reflow resistance may decrease.

The phenolic resin represented by the following formula (2) used for the present invention has a hydrophobic and rigid biphenylene structure between phenolic hydroxyl groups. Thus an epoxy resin composition using this phenolic resin produces a cured product having low moisture absorptivity. In addition, since distance between crosslinking points in the cured product becomes longer, elastic modulus at high temperature range over Tg is low. Thereby, the phenolic resin has low stress being generated and is excellent in adhesion, thus has excellent solder reflow resistance and is preferable. Further, the phenolic resin has a high aromatic ring containing rate in the resin structure, hence, the resin itself has a high flame resistance and heat resistance is relatively high though its low crosslinking density.

In the formula (2), R is hydrogen or an alkyl group having 1 to 4 carbons, which may be the same or different from each other. "a" is an integer of 0 to 4. "b" is an integer of 0 to 4. "c" is an integer of 0 to 3. "d" is an integer of 0 to 4. "n" is a mean value and 0 or a positive number of 10 or less. Among them, a resin represented by the following formula (2a) and the like is preferable from the viewpoint of curability. It is not preferable for "n" to exceed the upper limit since viscosity of the resin increases and the resin composition is inferior in flowability upon molding, thus, increase in the filling amount of the inorganic filler for attaining much lower moisture absorption becomes difficult.

Formula (2)

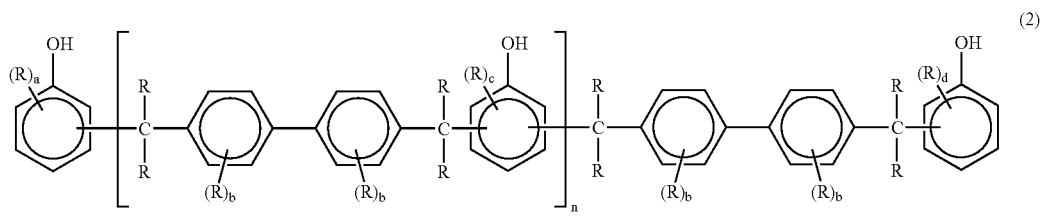

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less;

Formula (2a)

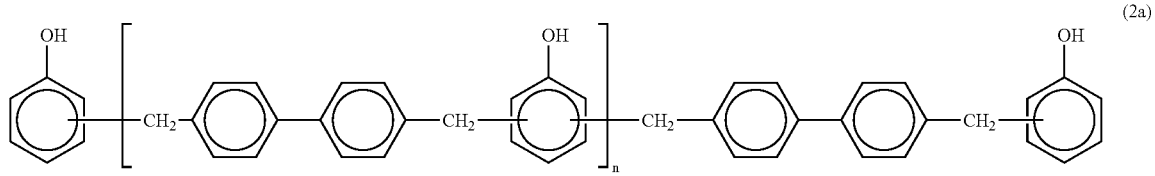

wherein "n" is a mean value and 0 or a positive number of 10 or less.

In the present invention, other phenolic resin may be used together as long as the features obtainable by using the phenolic resin represented by the formula (2) are not deteriorated. As the phenolic resin which may be used together, there may be a monomer, an oligomer, and a polymer having two or more phenolic hydroxyl groups in one molecule in general, the molecular weight and molecular structure of which may not be particularly limited. For example, there may be a phenol novolak resin, a cresol novolak resin, a naphthol aralkyl resin, a triphenolmethane resin, a terpene-modified phenolic resin, a dicyclopentadiene-modified phenolic resin, a phenol aralkyl resin having a phenylene structure or the like, one kind of which may be solely used, or two or more kinds of which may be used together.

As a compounding amount when other phenolic resin is used together, it is preferable that the amount of the phenolic resin represented by the formula (2) is 70 to 100 wt % of the total amount of the phenolic resin. If the content of the phenolic resin represented by the formula (2) lowers the lower limit, the moisture absorption rate may increase, the solder reflow resistance may decrease and the flame resistance may decline.

Equivalence ratio (a/b) of the number (a) of epoxy group in the total amount of the epoxy resin with respect to the number (b) of phenolic hydroxyl group in the total amount of the phenolic resin is preferably in the range of 0.5 to 2, more preferable 0.7 to 1.5. It is not preferable if the equivalence ratio is not in the above range since moisture resistance, curability or the like may deteriorate.

By using the epoxy resin (A) represented by the formula (1) and the phenolic resin (B) represented by the formula (2) of the present invention which are preliminarily molten and mixed, dispersibility improves. Also, particularly when the softening point of the epoxy resin (A) represented by the formula (1) is 45° C. or less, by preliminarily melting and mixing with the phenolic resin (B) represented by the formula (2) as mentioned above, the softening point of the molten mixture can be raised higher than that of the epoxy resin (A) so that handling of materials can be improved.

The curing accelerator used for the present invention may be one capable of promoting a crosslinking reaction between the epoxy group and the phenolic hydroxyl group. A curing accelerator which is generally used for an encapsulant can be used. For example, there may be diazabicycloalkene or a derivative thereof such as 1,8-diazabicyclo(5,4,0)undecene-7 or the like; organic phosphines such as triphenyl phosphine, methyldiphenyl phosphine or the like; an imidazole compound such as 2-methyl imidazole or the like; tetra-substituted phosphonium.tetra-substituted borate such as tetraphenyl phosphonium.tetraphenyl borate or the like, which may be used solely or in combination.

The inorganic filler used for the present invention may not be limited to specific kinds, and it allows the use of one generally used as an encapsulant can be used. For example, there may be fused silica, crystalline silica, secondary aggregated silica, alumina, titanium white, aluminum hydroxide, talc, clay, glass fiber or the like, one kind of which may be solely used, or two or more kinds of which may be used together. The fused silica is particularly preferable. Either crushed or spherical fused silica can be used. In order to increase the content of fused silica and inhibit increase of the melt viscosity of the epoxy resin composition, it is preferable mainly to use the spherical silica. Further, in order to increase the content of the spherical silica, it is preferable to adjust so that the particle size distribution of the spherical silica may be as wide as possible. The content of the total amount of the inorganic filler in the total of the epoxy resin composition may be essentially 84 wt % or more and 92 wt % or less from the viewpoint of balance between moldability and reliability, 87 wt % or more and 92 wt % or less may be preferable. It is not preferable if it is lower than the above-mentioned lower limit since low moisture absorptivity and low thermal expansion characteristics cannot be obtained and solder reflow resistance may be insufficient. It is not preferable if it exceeds the above-mentioned upper limit since flowability may decrease, there may be filling defect or the like upon molding and there may be inconvenience such as deformation of gold wire in a semiconductor device due to high viscosity or the like.

The triazole compound used for the present invention may be a compound having a five-membered ring structure containing a nitrogen atom. The triazole compound has effects of improving affinity between the resin composition and the surface of a preplating frame and inhibiting delamination of interface. Hence, the triazole compound can improve moisture resistance reliability and solder reflow resistance of a semiconductor device, wherein a semiconductor element is encapsulated with a cured product of the resin composition. Therefore, the reliability of the semiconductor device can improve.

As the triazole compound used for the present invention, a compound represented by the following formula (3) is preferable. If the triazole compound does not contain any mercapto groups, it may have no reactivity with metal. Thus, there is a possibility that reliability of the semiconductor device may not improve.

Formula (3)

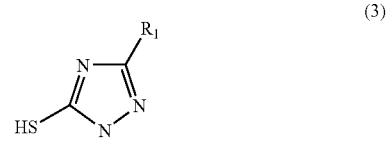

wherein $R_1$ is a hydrogen atom, or a functional group selected from the group consisting of a mercapto group, an amino group and a hydroxyl group, or a hydrocarbon chain having 1 to 5 carbons to which any one of the functional groups is added.

When $R_1$ of the formula (3) is the hydrocarbon chain having 1 to 5 carbons, it may have a functional group selected from the group consisting of a mercapto group, an amino group and a hydroxyl group.

In the present invention, an amount of the triazole compound to be added may not be particularly limited. 0.01 to 2 wt % of the total amount of the resin composition is preferable. If it lowers the above-mentioned lower limit, the effect of improving adhesion with a frame may decline. If it exceeds the above-mentioned upper limit, the flowability of the composition may decrease and the solder reflow resistance may decline.

Besides the above-mentioned (A) to (E) components, the epoxy resin composition of the present invention may contain, as required, various additives such as an inorganic ion exchanger including bismuth oxide hydrate or the like; a coupling agent including γ-glycidoxypropyl trimethoxy silane or the like; a colorant including carbon black, red iron oxide or the like; a low stress component including a silicone oil, a silicone rubber or the like; a release agent including a natural wax, a synthetic wax, higher fatty acid, metallic salts thereof, paraffin or the like; an antioxidant or the like.

Further, the inorganic filler may be preliminarily processed with the coupling agent, or the epoxy resin or the phenolic resin, if required. As the processing method, there may be a method of mixing the inorganic filler and the resin with the use of a solvent and then removing the solvent, a method of directly adding the resin to the inorganic filler to process by means of a mixer or the like.

The epoxy resin composition according to the first aspect of the present invention can be obtained by: mixing (A) to (E)

components, other additives and the like by means of a mixer at normal temperature; thereafter melting and kneading by means of a kneader such as an extrusion machine including a roll, a kneader and the like; cooling; and then crushing.

When producing a semiconductor device by encapsulating an electronic part such as a semiconductor element or the like with the use of the epoxy resin composition according to the first aspect, curing and molding may be performed in a conventional molding method such as transfer molding, compression molding, injection molding or the like.

The epoxy resin composition for encapsulating a semiconductor obtainable by the aforementioned first aspect has a flame resistance grade of V-0 of UL-94 without using a halogen based flame retardant, an antimony compound or other flame retarders. Also, the semiconductor device obtainable with the use of the epoxy resin composition is excellent in adhesion between a cured product of the resin composition and a lead frame, particularly a copper lead frame which is plated (silver plated lead frame, nickel plated lead frame, preplating frame such as gold plated nickel/palladium alloy or the like), and has an excellent solder reflow resistance upon mounting a semiconductor device. Therefore, the epoxy resin composition of the first aspect can be suitably used for an industrial production of a resin encapsulating type semiconductor device, particularly, a resin encapsulating type semiconductor device for a surface mount type.

Second Aspect

The second aspect of the present invention provides an epoxy resin composition for encapsulating a semiconductor essentially comprising (A) a phenol aralkyl type epoxy resin having a phenylene structure represented by the formula (1), (B) a phenol aralkyl type phenolic resin having a biphenylene structure represented by the formula (2), (F) organopolysiloxane having a carboxyl group, (G) oxidized polyethylene and (D) an inorganic filler, wherein (D) the inorganic filler is contained at the rate of 84 wt % or more and 92 wt % or less of the total amount of the epoxy resin composition, thereby, the epoxy resin composition for encapsulating a semiconductor has a flame resistance grade of V-0 of UL-94 without using a halogen based flame retardant, an antimony compound or other flame retarders, has an excellent solder reflow resistance and has an excellent productivity.

Also, the epoxy resin composition of the second aspect preferably contains (E) a triazole compound.

Hereinafter, each component will be explained in more detail.

Since the epoxy resin (A) represented by the formula (1), the phenolic resin (B) represented by the formula (2), the inorganic filler (D) and the triazole compound (E) used for the second aspect are similarly used as those of the aforementioned first aspect, the explanation is abbreviated.

In the second aspect, the organopolysiloxane having a carboxyl group is organopolysiloxane having one or more carboxyl groups in one molecule and needs to be used together with oxidized polyethylene. If organopolysiloxane having a carboxyl group is solely used, releasing property may be insufficient so that the continuous moldability may decline. If oxidized polyethylene is solely used, releasing property may be insufficient so that the compounding amount of oxidized polyethylene needs to be increased in order to obtain sufficient releasing property. In that case, adhesion declines, thus, solder heat resistance decreases and appearance of a molded article is not good.

Herein, the "solder heat resistance" means a heat resistance of the encapsulating resin required upon solder process including not only the solder reflow process but also the solder dipping process.

By using organopolysiloxane having a carboxyl group and oxidized polyethylene together, oxidized polyethylene can be blended to be compatible, the releasing property improves even if the compounding amount of oxidized polyethylene is small, both appearance and releasing property can be obtained, continuous molding is excellent and solder heat resistance does not lower. The ratio of compounding amount of the above described two components to be used together is preferably 5/1 to 1/5 in weight ratio, which is the most effective range.

As organopolysiloxane having a carboxyl group, organopolysiloxane represented by the following formula (4) is preferable. In the formula (4), at least one or more of R is an organic group having 1 to 40 carbons having a carboxyl group and the other of R is a group selected from the group consisting of hydrogen, a phenyl group and a methyl group, which may be the same or different from each other. If the number of carbon of the organic group having a carboxyl group exceeds the upper limit described above, compatibility with the resin deteriorates and the appearance of the molded article may deteriorate. "n" in the formula (4) is a mean value and a positive number of 1 to 50. If the value of "n" exceeds the upper limit, the viscosity of the organopolysiloxane itself increases so that the flowability may deteriorate.

By using organopolysiloxane represented by the formula (4), flowability does not decline, and the appearance of the molded article particularly improves. Further, by preliminarily melting and reacting the organopolysiloxane with the epoxy resin and the curing accelerator, soiling of a mold after continuous molding hardly occurs and continuous moldability improves significantly. Herein, the curing accelerator may be one capable of promoting curing reaction between the carboxyl group and the epoxy group in the resin composition. The same curing accelerator which is used for promoting the curing reaction referred hereafter between the epoxy group of the epoxy resin and the phenolic hydroxyl group of the phenolic resin may be used.

Though, the "organic group" includes hydrocarbon groups as a typical example, it may include various groups so far as its structure mainly has a hydrocarbon structure. It may contain a heteroatom other than carbon or hydrogen. The heteroatom may be present as a functional group at the end of or suspended from an organic group such as a carboxyl group, a hydroxyl group, a mercapto group, an amino group or the like, and a functional group intervened in a hydrocarbon chain such as an ether bond, an ester bond, an amide bond or the like.

The number of carbons of the organic group having a carboxyl group of organopolysiloxane represented by the formula (4) refers to the total number of carbons of the hydrocarbon group and the carboxyl group in the organic group.

Formula (4)

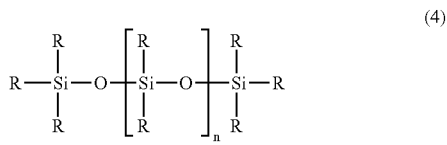

(4)

wherein at least one or more of R is an organic group having 1 to 40 carbons and having a carboxyl group and the other group of R is a group selected from the group consisting of hydrogen, a phenyl group and a methyl group, which may be the same or different from each other; and "n" is a mean value and a positive number of 1 to 50.

The compounding amount of the organopolysiloxane having a carboxyl group may be preferably 0.01 wt % or more and 3 wt % or less in the total amount of the epoxy resin composition. If it lowers the lower limit described above, the effect may not be sufficient so that there is a fear that soiling of appearance of molded article by a release agent cannot be inhibited. If it exceeds the upper limit described above, organopolysiloxane itself may soil the appearance of a molded article.

Also, other organopolysiloxane may be used together as far as the effect obtainable by adding organopolysiloxane having a carboxyl group is not declined.

Oxidized polyethylene to be used for the second aspect is one having a polar group comprising carboxylic acid or the like and a non-polar group comprising a long carbon chain. A production method of oxidized polyethylene for the second aspect may not be particularly limited, for example, oxidized polyethylene obtained by oxidizing high density polyethylene or the like is preferable. A dropping point of the oxidized polyethylene wax is preferably 60° C. or more and 140° C. or less, more preferably 100° C. or more and 130° C. or less. If the dropping point is lower than the lower limit described above, thermal stability may not be sufficient so that the oxidized polyethylene wax may cause the burnt in the mold to deteriorate releasing property and continuous moldability may be declined. If it exceeds the upper limit described above, the oxidized polyethylene wax may not be sufficiently molten upon curing the epoxy resin composition so that the dispersibility of the oxidized polyethylene wax may decline. Thereby, soiling of a mold due to the oxidized polyethylene wax which segregates on a surface of a cured product and deterioration of appearance of the cured product of the resin may be caused.

The maximum particle size of the oxidized polyethylene is preferably 150 μm or less. If the maximum particle size is larger than 150 μm, meltability upon molding deteriorates and material becomes uneven so that deterioration of releasing property and appearance of the molded article may be caused.

A mean particle size of the oxidized polyethylene is preferably 0.1 μm or more and 100 μm or less. If it is lower that the lower limit described above, compatibility between the oxidized polyethylene wax and the epoxy resin matrix is so high that the oxidized polyethylene wax cannot exude to the surface of a cured product, which may fail to impart a sufficient releasing effect. If it exceeds the upper limit described above, the oxidized polyethylene wax may segregate so that soiling of a mold and deterioration of appearance of the cured product of the resin may be caused.

The maximum particle diameter and the mean particle diameter are preferably measured by a laser diffraction particle size distribution analyzer, for example, the laser diffraction particle size distribution analyzer SALD-7000 (laser wavelength: 405 nm) manufactured by Shimadzu Corporation or the like may be used to measure. The measuring mode for the mean particle diameter is preferably the number average particle diameter.

The content of the oxidized polyethylene wax is preferably 0.01 wt % or more and 1 wt % or less in the total amount of the epoxy resin composition. If it lowers the lower limit described above, the releasing property may be insufficient. If it exceeds the upper limit described above, adhesion with a lead frame member may deteriorate and may cause delamination from the member upon solder processing. Also, soiling of a mold or deterioration of appearance of a cured product of the resin may be caused.

Other release agent may be used together as far as the effect obtainable by adding oxidized polyethylene is not declined. For example, there may be a natural wax such as carnauba wax or the like; metallic salts of higher fatty acid such as zinc stearate or the like; fatty esters or the like.

The epoxy resin composition of the second aspect comprises (A), (B), (D), (F), and (G) components, and preferably further comprises (E) component. If required, a curing accelerator which promotes curing reaction between the epoxy group and the phenolic hydroxyl group can be added. As the curing accelerator, for example, there may be diazabicycloalkene or a derivative thereof such as 1,8-diazabicyclo(5, 4,0)undecene-7 or the like; organic phosphines such as triphenyl phosphine, methyldiphenyl phosphine or the like; an imidazole compound such as 2-methyl imidazole or the like; tetra-substituted phosphonium-tetra-substituted borate such as tetraphenyl phosphonium-tetraphenyl borate or the like, which may be used solely or in combination.

Besides the above-mentioned components, the epoxy resin composition of the present invention may contain, as required, various additives such as an inorganic ion exchanger including bismuth oxide hydrate or the like; a coupling agent including γ-glycidoxypropyl trimethoxy silane or the like; a colorant including carbon black, red iron oxide or the like; a low stress component such as a silicone oil, a silicone rubber or the like; an antioxidant or the like. Further, if required, the inorganic filler may be preliminarily processed with any processing agent such as the coupling agent, or the epoxy resin or the phenolic resin, and thereafter be used. As the processing method, there may be a method of mixing the inorganic filler and the processing agent with the use of a solvent and then removing the solvent, a method of directly adding the processing agent to the inorganic filler to process by means of a mixer or the like.

The epoxy resin composition of the second aspect can be obtained by: mixing the above components, other additives and the like by means of a mixer at normal temperature; thereafter melting and kneading by means of a kneader such as a roll, an extrusion machine, and the like; cooling; and then crushing.

When producing a semiconductor device by encapsulating an electronic part such as a semiconductor element or the like with the use of the epoxy resin composition of the second aspect, curing and molding may be performed in a conventional molding method such as transfer molding, compression molding, injection molding or the like.

The epoxy resin composition for encapsulating a semiconductor obtainable by the aforementioned second aspect has a flame resistance grade of V-0 of UL-94 without using a halogen based flame retardant, an antimony compound or other flame retarders. Also, the semiconductor device obtainable with the use of the epoxy resin composition is excellent in adhesion between a cured product of the resin composition and a lead frame, particularly a copper lead frame which is plated (silver plated lead frame, nickel plated lead frame, preplating frame such as gold plated nickel/palladium alloy or the like) by adding the triazole compound in the epoxy resin composition, has an excellent solder reflow resistance upon mounting a semiconductor device, and further has an excellent productivity. Therefore, the epoxy resin composition of the second aspect can be suitably used for an industrial production of a resin encapsulating type semiconductor device, particularly, a resin encapsulating type semiconductor device for a surface mount type.

Third Aspect

The third aspect of the present invention provides an epoxy resin composition for encapsulating a semiconductor essentially comprising (A) an epoxy resin represented by the formula (1), (B) a phenolic resin represented by the formula (2), (H) a curing accelerator represented by the formula (5), (I) a silane coupling agent and (D) an inorganic filler, wherein the (H) component is contained at the rate of 0.05 wt % or more and 0.5 wt % or less and the (D) component is contained at the rate of 84 wt % or more and 92 wt % or less of the total amount of the epoxy resin composition, thereby, the epoxy resin composition for encapsulating a semiconductor has a flame resistance grade of V-0 of UL-94 without using a halogen based flame retardant, an antimony compound or other flame retarders while not deteriorate flowability, and has high solder reflow resistance which can be used for a lead-free solder.

Hereinafter, each component will be explained in more detail.

In the third aspect, since the epoxy resin (A) represented by the formula (1), the phenolic resin (B) represented by the formula (2) and the inorganic filler (D) are similarly used as those of the aforementioned first aspect, the explanation is abbreviated.

The curing accelerator (H) represented by the formula (5) is a molecular compound of tetra-substituted phosphonium and dihydroxy naphthalene, which has both storage stability upon storing the epoxy resin composition and quick curing upon molding to encapsulate. The curing accelerator (H) represented by the formula (5) is essentially contained at the rate of 0.05 wt % or more and 0.5 wt % or less of the total amount of the epoxy resin composition, preferably at the rate of 0.1 wt % or more and 0.4 wt % or less. If it is in the range described above, decline of curability of the epoxy resin composition can be inhibited and raise of problems such as lowering of flowability upon molding to encapsulate, failure in filling, deformation of a gold wire or the like.

Formula (5)

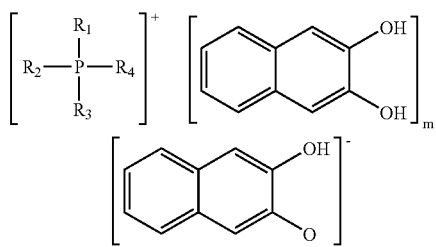

wherein P is a phosphorus atom; each of $R_1$ to $R_4$ is an organic group having 6 to 20 carbons containing an aromatic ring or an aliphatic hydrocarbon group having 1 to 20 carbons, which may be the same or different from each other; and "m" is a number of $0 \leq m \leq 2$.

In the third aspect, if required, a curing accelerator which promotes curing reaction between the epoxy group and the phenolic hydroxyl group and generally used for an encapsulant can be used together with the curing accelerator (C) represented by the formula (5). As the curing accelerator which may be used together, there may be diazabicycloalkene or a derivative thereof such as 1,8-diazabicyclo(5,4,0)undecene-7 or the like; an amine compound such as tributyl amine, benzyldimethyl amine or the like; an organic phosphorus compound such as tetraphenyl phoshonium.tetranaphtoic acid borate, triphenyl phosphine or the like, but may not be limited. The curing accelerator which may be used together may be solely, or two or more kinds thereof may be used together. Among them, 1,8-diazabicyclo(5,4,0)undecene-7 is particularly useful for improving adhesion to various substrates. Also, tetraphenyl phoshonium.tetranaphtoic acid borate has an effect to improve the storage stability at normal temperature of the epoxy resin composition significantly.

The silane coupling agent (I) may not be particularly limited to epoxy silane, amino silane, ureide silane, mercapto silane and the like, and it includes any silane coupling agent which reacts between the epoxy resin composition and the inorganic filler to improve the strength at interface between the epoxy resin composition and the inorganic filler.

Also, since the silane coupling agent (I) forms a relatively stable intermediate with a compound in which a hydroxyl group is bonded to each of two or more adjacent carbon atoms constituting an aromatic ring such as the curing accelerator (H) represented by the formula (5), an effect to delay curing of the curing accelerator (H) represented by the formula (5) can be exhibited, storage stability of the epoxy resin composition upon storage, and viscosity characteristics and flowability characteristics upon molding to encapsulate can be significantly improved. Hence, the silane coupling agent (I) is essential to obtain a sufficient effect of the curing accelerator (H) represented by the formula (5). The silane coupling agent (I) may be used solely or in combination of two or more kinds. The compounding amount of the silane coupling agent (I) is preferably 0.01 wt % or more and 1 wt % or less, more preferably 0.05 wt % or more and 0.8 wt % or less, furthermore preferably 0.1 wt % or more and 0.6 wt % or less. If the compounding amount of the silane coupling agent (I) is in the range described above, the effect of the curing accelerator (H) represented by the formula (5) can be sufficiently exhibited. Also, the decline of solder crack resistance in a semiconductor device (hereafter it may be referred as "semiconductor package" or simply "package") due to the decline of adhesion between a cured product of the epoxy resin composition and various substrates can be suppressed. In addition, the decline of solder crack resistance in the semiconductor package due to increase of the water absorption property of the epoxy resin composition can be suppressed.

The epoxy resin composition of the third aspect comprises the above components and may contain, as required, various additives such as a colorant including carbon black, red iron oxide or the like; a low stress component such as a silicone oil, a silicone rubber or the like; a release agent including a natural wax, a synthetic wax, higher fatty acid, metallic salts thereof, paraffin or the like; an inorganic ion exchanger including bismuth oxide hydrate or the like; an antioxidant or the like. Further, if required, the inorganic filler may be preliminarily processed with any processing agent such as the coupling agent, or the epoxy resin or the phenolic resin, and thereafter be used. As the processing method, there may be a method of mixing the inorganic filler and the processing agent with the use of a solvent and then removing the solvent, a method of directly adding the processing agent to the inorganic filler to process by means of a mixer or the like.

The epoxy resin composition of the third aspect can be obtained by: mixing the above components, other additives and the like by means of a mixer at normal temperature;

thereafter melting and kneading by means of a kneader such as a roll, an extrusion machine, and the like; cooling; and then crushing.

When producing a semiconductor device by encapsulating an electronic part such as a semiconductor element or the like with the use of the epoxy resin composition of the third aspect, curing and molding may be performed in a conventional molding method such as transfer molding, compression molding, injection molding or the like.

EXAMPLES

Examples of the present invention are hereinafter described. The scope of the present invention is not restricted by these examples. The compounding ratio is expressed by "part by weight".

Hereinafter, Example series (1) is regarding the first aspect, Example series (2) is regarding the second aspect and Example series (3) is regarding the third aspect.

Example Series (1)

Example (1)-1

The following components were mixed with each other by means of a mixer, and thereafter the mixture was mixed and kneaded by means of two rolls having a surface temperature of 95° C. and 25° C. respectively. Then, the mixture was cooled and grinded to obtain an epoxy resin composition. Properties of the obtained epoxy resin composition were evaluated in the following manner. The evaluation results are shown in Table 1.

Epoxy resin 1: an epoxy resin represented by the following formula (1a) (softening point 44° C., epoxy equivalent 234, hereafter referred as "E-1") 6.21 parts by weight Formula (1a)

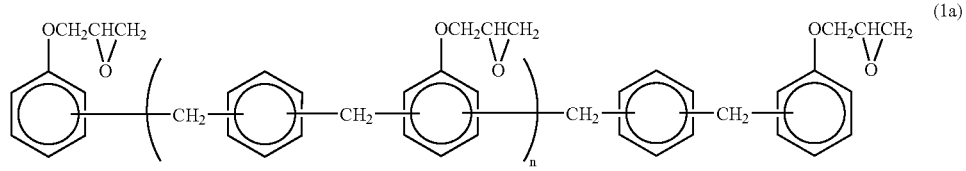

Phenolic resin 1: a phenolic resin represented by the following formula (2a) (softening point 107° C., hydroxyl group equivalent 234, hereinafter referred as "H-1")
4.89 parts by weight Formula (2a)

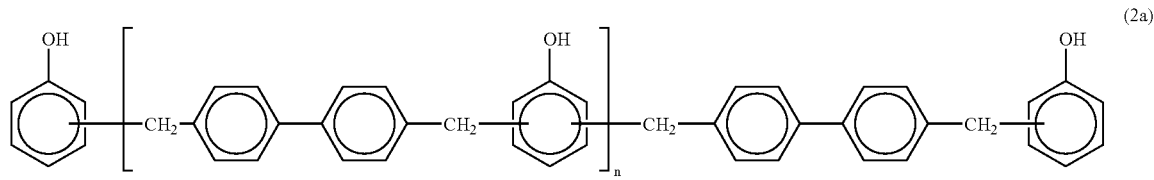

1,8-Diazabicyclo(5,4,0)undecen-7 (hereafter referred as "DBU") 0.20 parts by weight Fused spherical silica (mean particle diameter 25 μm) 88.00 parts by weight 1,2,4-Triazole-5-thiol (reagent) represented by the following formula (3a) 0.10 parts by weight Formula (3a)

Carnauba wax 0.20 parts by weight
Carbon black 0.40 parts by weight

Evaluation Method

Spiral flow: The Spiral flow was measured with the use of a mold for measuring spiral flow with reference to EMMI-1-66 under the condition of a mold temperature of 175° C., an injection pressure of 9.3 MPa and a curing time of 120 seconds. A measured unit was "cm". When the measured value is 80 cm or less, molding may be deteriorated such as unfilled package or the like.

Adhesion strength: 10 test samples for adhesion strength test with the size of 2 mm×2 mm×2 mm were molded per one level on a lead frame under the condition of a mold temperature of 175° C., an injection pressure of 9.8 MPa and a curing time of 120 seconds by means of a transfer molding machine. Herein, "one level" means one combination of one kind of the epoxy resin composition with one kind of the frame. As the lead frame, two kinds, namely a silver plated copper frame (frame 1) and a gold plated NiPd alloy frame (frame 2) were used. Then, shear strength between the cured product of the epoxy resin composition and the lead frame were measured by means of the automatic shear strength tester PC2400 manufactured by DAGE. A measured unit of shear strength is "$N/mm^2$".

Flame resistance: a test sample with the size of 127 mm×12.7 mm×1.6 mm was molded under the condition of a mold temperature of 175° C., an injection pressure of 9.8 MPa and a curing time of 120 seconds by means of a transfer molding machine, and subject to after baking at 175° C. for 8 hours. Then, ΣF and $F_{max}$ were measured with reference to the UL-94 vertical method to assess flame resistance.

Solder reflow resistance: 80 pQFP (80 pin preplating frame, Au plated NiPd alloy, package outer size: 14 mm×20 mm×thickness 2 mm, pad size: 8 mm×8 mm, chip size: 7 mm×7 mm) was molded under the condition of a tool temperature of 175° C., an injection pressure of 9.6 MPa and a curing time of 90 seconds by means of a transfer molding device, and subject to post curing at 175° C. for 8 hours. The obtained package was subject to a moisture absorption treatment for 168 hours in an atmosphere of 85° C. and 60% relative humidity. And then the package was dipped in a solder vessel of 260° C. for 10 seconds. 10 packages dipped in solder were observed by means of the scanning acoustic microscope detector to obtain a rate of delamination at interface of a semiconductor element and a cured product of an epoxy resin composition, that is, the rate of delamination represented by [(number of delaminated packages)/(total number of packages)×100] in percentage.

Examples (1)-2 to (1)-12

Comparative Examples (1)-1 to (1)-6

According to the compounding amount in Tables 1, 2 and 3, an epoxy resin composition was obtained in the manner similarly to Example (1)-1 and evaluation was performed in the manner similarly to Example (1)-1. The evaluation results are shown in Tables 1, 2 and 3.

The materials not used in Example (1)-1 are as follows.

Epoxy resin 2: an epoxy resin represented by the following formula (1a) (softening point 55° C., epoxy equivalent 236, hereafter referred as "E-2"):

Formula (1a)

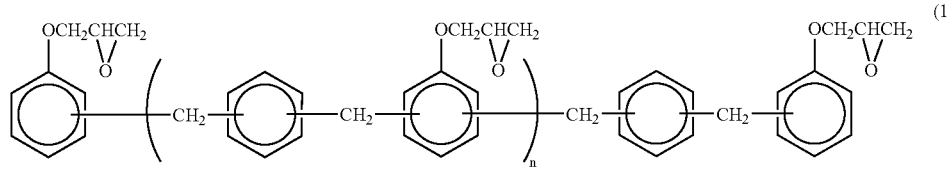

Epoxy resin 3: an o-cresol novolak type epoxy resin EOCN-1020 62 (manufactured by Nippon Kayaku Co. Ltd., epoxy equivalent 200, softening point 62° C., hereafter referred as "E-3")

Phenolic resin 2: a p-xylene-modified novolak type phenolic resin XLC-4L (manufactured by Mitsui Chemicals, Inc., hydroxyl group equivalent 168, softening point 62° C., hereinafter referred as "H-2")

Molten mixture A: a mixture obtained by melting and mixing E-1 (55.9 parts by weight) with H-1 (44.1 parts by weight) at 120° C. for 30 minutes.

3-Amino-1,2,4-triazole-5-thiol (reagent) represented by the following formula (3b):

Formula (3b)

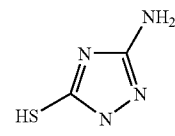

3,5-Dimercapto-1,2,4-triazole (reagent) represented by the following formula (3c):

Formula (3c)

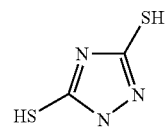

3-Hydroxy-1,2,4-triazole-5-thiol (reagent) represented by the following formula (3d):

Formula (3d)

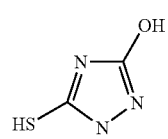

5-Mercapto-1,2,4-triazole-3-methanol (reagent) represented by the following formula (3e):

Formula (3e)

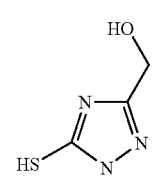

2-(4'-Morpholinodithio)benzothiazole (manufactured by KAWAGUCHI CHEMICAL INDUSTRY CO,. LTD.) represented by the following formula (6):

Formula (6)

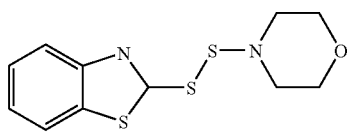

TABLE 1

|  | (1)-1 | (1)-2 | (1)-3 | (1)-4 | (1)-5 | (1)-6 |
|---|---|---|---|---|---|---|
| E-1 | 6.21 |  | 4.70 | 6.35 | 6.21 | 6.21 |
| E-2 |  | 6.23 |  |  |  |  |
| E-3 |  |  | 1.40 |  |  |  |
| H-1 | 4.89 | 4.87 | 5.00 | 3.55 | 4.89 | 4.89 |
| H-2 |  |  |  | 1.20 |  |  |
| DBU | 0.20 | 0.20 | 0.20 | 0.20 | 0.20 | 0.20 |
| Fused spherical silica | 88.00 | 88.00 | 88.00 | 88.00 | 88.00 | 88.00 |
| 1,2,4-Triazole-5-thiol | 0.10 | 0.10 | 0.10 | 0.10 |  |  |

TABLE 1-continued

|  |  | (1)-1 | (1)-2 | (1)-3 | (1)-4 | (1)-5 | (1)-6 |
|---|---|---|---|---|---|---|---|
| (formula (3a)) |  |  |  |  |  |  |  |
| 3-Amino-1,2,4-triazole-5-thiol (formula (3b)) |  |  |  |  |  | 0.10 |  |
| 3,5-Dimercapto-1,2,4-triazole (formula (3c)) |  |  |  |  |  |  | 0.10 |
| Carnauba wax |  | 0.20 | 0.20 | 0.20 | 0.20 | 0.20 | 0.20 |
| Carbon black |  | 0.40 | 0.40 | 0.40 | 0.40 | 0.40 | 0.40 |
| Spiral flow (cm) |  | 95 | 90 | 85 | 90 | 85 | 90 |
| Adhesion strength ($N/mm^2$) | Frame 1 | 12.5 | 12.0 | 11.5 | 11.5 | 13.5 | 11.0 |
|  | Frame 2 | 12.0 | 11.5 | 10.5 | 11.0 | 13.0 | 11.0 |
| Flame resistance (UL-94) |  | V-0 | V-0 | V-0 | V-0 | V-0 | V-0 |
| Solder reflow resistance | Chip delamination rate (%) | 0 | 0 | 0 | 0 | 0 | 0 |
|  | Inner lead portion delamination rate (%) | 0 | 0 | 0 | 0 | 0 | 0 |

TABLE 2

|  |  | (1)-7 | (1)-8 | (1)-9 | (1)-10 | (1)-11 | (1)-12 |
|---|---|---|---|---|---|---|---|
| E-1 |  | 6.21 | 6.21 | 5.43 |  | 7.88 | 4.53 |
| H-1 |  | 4.89 | 4.89 | 4.27 |  | 6.22 | 3.57 |
| Molten mixture A |  |  |  |  | 11.10 |  |  |
| DBU |  | 0.20 | 0.20 | 0.20 | 0.20 | 0.20 | 0.20 |
| Fused spherical silica |  | 88.00 | 88.00 | 88.00 | 88.00 | 85.00 | 91.00 |
| 1,2,4-Triazole-5-thiol (formula (3a)) |  |  |  | 1.50 | 0.10 | 0.10 | 0.10 |
| 3-Hydroxy-1,2,4-triazole-5-thiol (formula (3d)) |  | 0.10 |  |  |  |  |  |
| 5-Mercapto-1,2,4-triazole-3-methanol (formula (3e)) |  |  | 0.10 |  |  |  |  |
| Carnauba wax |  | 0.20 | 0.20 | 0.20 | 0.20 | 0.20 | 0.20 |
| Carbon black |  | 0.40 | 0.40 | 0.40 | 0.40 | 0.40 | 0.40 |
| Spiral flow (cm) |  | 95 | 95 | 85 | 90 | 110 | 80 |
| Adhesion strength ($N/mm^2$) | Frame 1 | 9.0 | 9.5 | 14.5 | 11.5 | 13.0 | 9.0 |
|  | Frame 2 | 9.0 | 9.0 | 14.0 | 11.5 | 13.0 | 9.0 |
| Flame resistance (UL-94) |  | V-0 | V-0 | V-0 | V-0 | V-0 | V-0 |
| Solder reflow resistance | Chip delamination rate (%) | 0 | 0 | 10 | 0 | 0 | 0 |
|  | Inner lead portion delamination rate (%) | 0 | 0 | 0 | 0 | 10 | 0 |

TABLE 3

|  |  | (1)-1 | (1)-2 | (1)-3 | (1)-4 | (1)-5 | (1)-6 |
|---|---|---|---|---|---|---|---|
| E-1 |  | 6.26 | 6.21 | 9.56 | 2.29 |  | 6.72 |
| E-3 |  |  |  |  |  | 5.77 |  |
| H-1 |  | 4.94 | 4.89 | 7.54 | 1.81 | 5.33 |  |
| H-2 |  |  |  |  |  |  | 4.38 |
| DBU |  | 0.20 | 0.20 | 0.20 | 0.20 | 0.20 | 0.20 |
| Fused spherical silica |  | 88.00 | 88.00 | 82.00 | 95.00 | 88.00 | 88.00 |
| 1,2,4-Triazole-5-thiol (formula (3a)) |  |  |  |  | 0.10 | 0.10 | 0.10 | 0.10 |
| 2-(4'-Morpholinodithio)benzothiazole (formula (6)) |  |  | 0.10 |  |  |  |  |
| Carnauba wax |  | 0.20 | 0.20 | 0.20 | 0.20 | 0.20 | 0.20 |
| Carbon black |  | 0.40 | 0.40 | 0.40 | 0.40 | 0.40 | 0.40 |
| Spiral flow (cm) |  | 95 | 80 | 125 | 30 | 80 | 85 |
| Adhesion strength ($N/mm^2$) | Frame 1 | 3.0 | 5.5 | 13.5 | 8.5 | 10.0 | 10.5 |
|  | Frame 2 | 2.5 | 4.5 | 13.5 | 7.5 | 9.5 | 10.5 |
| Flame resistance (UL-94) |  | V-0 | V-0 | V-1 | V-0 | V-1 | V-1 |

TABLE 3-continued

| | | Comparative Example | | | | | |
|---|---|---|---|---|---|---|---|
| | | (1)-1 | (1)-2 | (1)-3 | (1)-4 | (1)-5 | (1)-6 |
| Solder reflow resistance | Chip delamination rate (%) | 40 | 30 | 50 | failure in filling | 20 | 30 |
| | Inner lead portion delamination rate (%) | 50 | 40 | 50 | failure in filling | 40 | 40 |

Example Series (2)

Example (2)-1

The following components were mixed with each other by means of a mixer, and thereafter the mixture was mixed and kneaded by means of two rolls having a surface temperature of 95° C. and 25° C. respectively. Then, the mixture was cooled and grinded to obtain an epoxy resin composition. Properties of the obtained epoxy resin composition were evaluated in the following manner. The evaluation results are shown in Table 4.

Epoxy resin 1: an epoxy resin represented by the following formula (1a) (softening point 44° C., epoxy equivalent 234, hereafter referred as "E-1") 6.09 parts by weight Formula (1a)

Organopolysiloxane represented by the following formula (4a) (hereafter referred as "organopolysiloxane 1")
0.20 parts by weight Formula (4a)

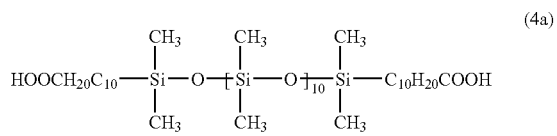

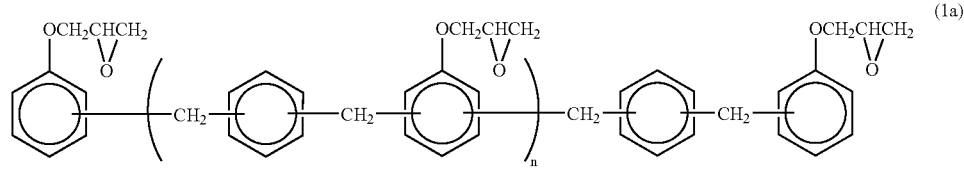

Phenolic resin 1: a phenolic resin represented by the following formula (2a) (softening point 107° C., hydroxyl group equivalent 203, hereinafter referred as "H-1")
4.41 parts by weight Formula (2a)

Oxidized polyethylene wax 1 (high density oxidized polyethylene having dropping point 120° C., maximum particle diameter 100 μm and mean particle diameter 50 μm)
0.20 parts by weight
Fused spherical silica (mean particle diameter 25 μm)
88.00 parts by weight

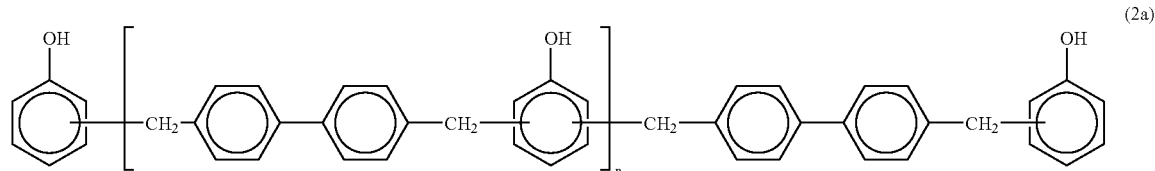

1,2,4-Triazole-5-thiol (reagent) represented by the following formula (3a) 0.10 parts by weight Formula (3a)

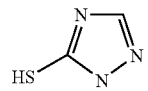

1,8-Diazabicyclo(5,4,0)undecene-7 (hereafter referred as "DBU") 0.20 parts by weight
Coupling agent (γ-glycidoxypropyl trimethoxysilane 0.40 parts by weight
Carbon black 0.40 parts by weight Evaluation Method Spiral flow: The Spiral flow was measured with the use of a mold for measuring spiral flow with reference to EMMI-1-66 under the condition of a mold temperature of 175° C., an injection pressure of 9.3 MPa and a curing time of 120 seconds. A measured unit was "cm". When the measured value is 80 cm or less, molding may be deteriorated such as unfilled package or the like.

Flame resistance: a test sample with the size of 127 mm×12.7 mm×1.6 mm was molded under the condition of a mold temperature of 175° C., an injection pressure of 9.8 MPa and a curing time of 120 seconds by means of a transfer molding machine, and subject to after baking at 175° C. for 8 hours. Then, $\Sigma F$ and $F_{max}$ were measured with reference to the UL-94 vertical method to assess flame resistance.

Continuous moldability: 80 pQFP (80 pin preplating frame, Au plated NiPd alloy, package outer size: 14 mm×20 mm×thickness 2 mm, pad size: 8 mm×8 mm, chip size: 7 mm×7 mm) was molded continuously until 700 shots under the condition of a mold temperature of 175° C., an injection pressure of 9.6 MPa and a curing time of 90 seconds by means of a low pressure automatic transfer molding machine. The evaluation criteria was "⊚" when continuous molding was capable until 700 shots without any problem of failure in filling or the like, "○" when continuous molding was capable until 500 shots without any problem of failure in filling or the like, and "X" for others.

Soiling of appearance of molded article and mold: soling of the package and the mold after 500 and 700 shots of continuous molding was visually evaluated. The evaluation criteria of soiling of appearance of the molded article and soiling of the mold was "⊚" when they were clean until 700 shots, "○" when they were clean until 500 shots, and "X" when they were soiled.

Solder reflow resistance: the package molded by the above-mentioned continuous molding was subject to post curing at 175° C. for 8 hours. The obtained package was subject to a moisture absorption treatment for 168 hours in an atmosphere of 85° C. and 60% relative humidity. And then the package was dipped in a solder vessel of 260° C. for 10 seconds. 10 packages dipped in solder were observed by means of the scanning acoustic microscope detector to obtain a rate of delamination at interface of a semiconductor element and a cured product of an epoxy resin composition, that is, the rate of delamination represented by [(number of delaminated packages)/(total number of packages)×100] in percentage.

Examples (2)-2 to (2)-18

Comparative Examples (2)-1 to (2)-9

According to the compounding amount in Tables 4, 5 and 6, an epoxy resin composition was obtained in the manner similarly to Example (2)-1 and evaluation was performed in the manner similarly to Example (2)-1. The evaluation results are shown in Tables 4, 5 and 6.

The materials not used in Example (2)-1 are as follows.

Epoxy resin 2: an epoxy resin represented by the following formula (1a) (softening point 55° C., epoxy equivalent 236, hereafter referred as "E-2"):

Formula (1a)

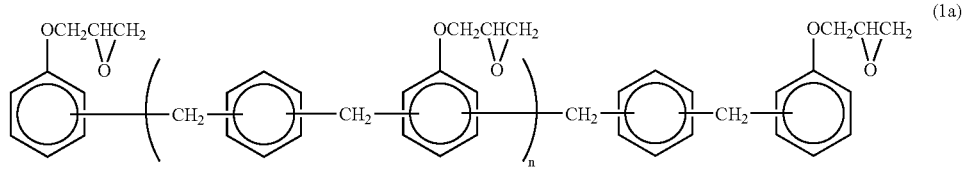

Epoxy resin 3: an o-cresol novolak type epoxy resin EOCN-1020 62 (manufactured by Nippon Kayaku Co. Ltd., epoxy equivalent 200, softening point 62° C., hereafter referred as "E-3")

Phenolic resin 2: a p-xylene-modified novolak type phenolic resin XLC-4L (manufactured by Mitsui Chemicals, Inc., hydroxyl group equivalent 168, softening point 62° C., hereinafter referred as "H-2")

Molten mixture A: a mixture obtained by melting and mixing E-1 (55.9 parts by weight) with H-1 (44.1 parts by weight) at 120° C. for 30 minutes.

Organopolysiloxane represented by the following formula (4b) (hereafter referred as "organopolysiloxane 2"):

Formula (4b)

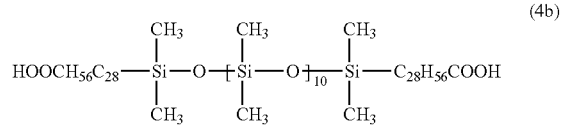

Organopolysiloxane represented by the following formula (4c) (hereafter referred as "organopolysiloxane 3"):

Formula (4c)

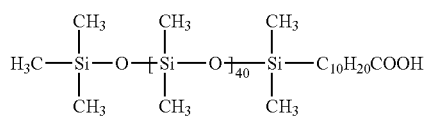

Organopolysiloxane represented by the following formula (7)(hereafter referred as "organopolysiloxane 4"):

Formula (7)

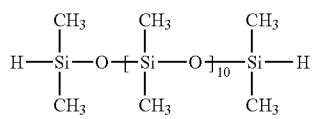

Molten product A: 66.1 parts by weight of a bisphenol A type epoxy resin YL-6810 (manufactured by Japan Epoxy Resins Co., Ltd., epoxy equivalent 170 g/eq, melting point 47° C.) was heated to melt at 140° C. Therein, 33.1 parts by weight of organopolysiloxane 3 (organopolysiloxane represented by formula (4c)) and 0.8 parts by weight of triphenylphosphine were added. After melting and mixing for 30 minutes, a molten product A was obtained.

Oxidized polyethylene wax 2 (high density oxidized polyethylene having dropping point 110° C., maximum particle diameter 100 μm and mean particle diameter 80 μm)

Oxidized polyethylene wax 3 (high density oxidized polyethylene having dropping point 125° C., maximum particle diameter 100 μm and mean particle diameter 5 μm)

Carnauba Wax 3-amino-1,2,4-triazole-5-thiol (reagent) represented by the following formula (3b):

Formula (3b)

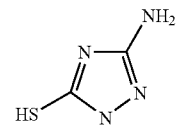

TABLE 4

|  | Example | | | | | | | | |
| --- | --- | --- | --- | --- | --- | --- | --- | --- | --- |
|  | (2)-1 | (2)-2 | (2)-3 | (2)-4 | (2)-5 | (2)-6 | (2)-7 | (2)-8 | (2)-9 |
| E-1 | 6.09 |  | 4.49 | 6.22 | 6.09 | 6.09 | 6.09 | 6.09 | 6.15 |
| E-2 |  | 6.12 |  |  |  |  |  |  |  |
| E-3 |  |  | 1.50 |  |  |  |  |  |  |
| H-1 | 4.41 | 4.38 | 4.51 | 3.21 | 4.41 | 4.41 | 4.41 | 4.41 | 4.45 |
| H-2 |  |  |  | 1.07 |  |  |  |  |  |
| Organopolysiloxane 1 | 0.20 | 0.20 | 0.20 | 0.20 |  |  | 0.20 | 0.20 | 0.10 |
| Organopolysiloxane 2 |  |  |  |  | 0.20 |  |  |  |  |
| Organopolysiloxane 3 |  |  |  |  |  | 0.20 |  |  |  |
| Oxidized polyethylene wax 1 | 0.20 | 0.20 | 0.20 | 0.20 | 0.20 | 0.20 |  |  | 0.20 |
| Oxidized polyethylene wax 2 |  |  |  |  |  |  | 0.20 |  |  |
| Oxidized polyethylene wax 3 |  |  |  |  |  |  |  | 0.20 |  |
| Fused spherical silica | 88.00 | 88.00 | 88.00 | 88.00 | 88.00 | 88.00 | 88.00 | 88.00 | 88.00 |
| 1,2,4-Triazole-5-thiol (formula (3a)) | 0.10 | 0.10 | 0.10 | 0.10 | 0.10 | 0.10 | 0.10 | 0.10 | 0.10 |
| DBU | 0.20 | 0.20 | 0.20 | 0.20 | 0.20 | 0.20 | 0.20 | 0.20 | 0.20 |
| Coupling agent | 0.40 | 0.40 | 0.40 | 0.40 | 0.40 | 0.40 | 0.40 | 0.40 | 0.40 |
| Carbon black | 0.40 | 0.40 | 0.40 | 0.40 | 0.40 | 0.40 | 0.40 | 0.40 | 0.40 |
| Spiral flow (cm) | 105 | 100 | 95 | 100 | 95 | 85 | 105 | 100 | 100 |
| Flame resistance (UL-94) | V-0 | V-0 | V-0 | V-0 | V-0 | V-0 | V-0 | V-0 | V-0 |
| Continuous moldability | ⊚ | ⊚ | ⊚ | ⊚ | ○ | ⊚ | ⊚ | ○ | ⊚ |
| Soiling of appearance of molded article and mold | ⊚ | ⊚ | ⊚ | ⊚ | ⊚ | ○ | ⊚ | ⊚ | ○ |
| Solder reflow resistance — Chip delamination rate (%) | 0 | 0 | 0 | 0 | 0 | 0 | 0 | 0 | 0 |
| Solder reflow resistance — Inner lead portion delamination rate (%) | 0 | 0 | 0 | 0 | 0 | 0 | 10 | 0 | 0 |

TABLE 5

| | Example | | | | | | | | |
|---|---|---|---|---|---|---|---|---|---|
| | (2)-10 | (2)-11 | (2)-12 | (2)-13 | (2)-14 | (2)-15 | (2)-16 | (2)-17 | (2)-18 |
| E-1 | 5.69 | 5.86 | 6.18 | 5.75 | 6.09 | 6.15 | | 7.84 | 4.35 |
| H-1 | 4.11 | 4.24 | 4.47 | 4.15 | 4.41 | 4.45 | | 5.66 | 3.15 |
| Molten mixture A | | | | | | | 10.50 | | |
| Organopolysiloxane 1 | 0.90 | | 0.20 | 0.20 | 0.20 | 0.20 | 0.20 | 0.20 | 0.20 |
| Molten product A | | 0.60 | | | | | | | |
| Oxidized polyethylene wax 1 | 0.20 | 0.20 | 0.05 | 0.80 | 0.20 | 0.20 | 0.20 | 0.20 | 0.20 |
| Fused spherical silica | 88.00 | 88.00 | 88.00 | 88.00 | 88.00 | 88.00 | 88.00 | 85.00 | 91.00 |
| 1,2,4-Triazole-5-thiol (formula (3a)) | 0.10 | 0.10 | 0.10 | 0.10 | | | 0.10 | 0.10 | 0.10 |
| 3-Amino-1,2,4-triazole-5-thiol (formula (3b)) | | | | | | 0.10 | | | |
| DBU | 0.20 | 0.20 | 0.20 | 0.20 | 0.20 | 0.20 | 0.20 | 0.20 | 0.20 |
| Coupling agent | 0.40 | 0.40 | 0.40 | 0.40 | 0.40 | 0.40 | 0.40 | 0.40 | 0.40 |
| Carbon black | 0.40 | 0.40 | 0.40 | 0.40 | 0.40 | 0.40 | 0.40 | 0.40 | 0.40 |
| Spiral flow (cm) | 110 | 115 | 105 | 100 | 95 | 105 | 100 | 120 | 85 |
| Flame resistance (UL-94) | V-0 | V-0 | V-0 | V-0 | V-0 | V-0 | V-0 | V-0 | V-0 |
| Continuous moldability | ◎ | ◎ | ○ | ◎ | ◎ | ◎ | ◎ | ◎ | ◎ |
| Soiling of appearance of molded article and mold | ○ | ◎ | ◎ | ◎ | ◎ | ◎ | ◎ | ◎ | ◎ |
| Solder reflow resistance Chip delamination rate (%) | 0 | 0 | 0 | 10 | 0 | 0 | 0 | 0 | 0 |
| Inner lead portion delamination rate (%) | 10 | 0 | 0 | 0 | 0 | 10 | 0 | 10 | |

TABLE 6

| | Comparative Example | | | | | | | | |
|---|---|---|---|---|---|---|---|---|---|
| | (2)-1 | (2)-2 | (2)-3 | (2)-4 | (2)-5 | (2)-6 | (2)-7 | (2)-8 | (2)-9 |
| E-1 | 6.21 | 6.21 | 6.09 | 6.09 | 6.33 | 9.58 | 2.03 | | 6.57 |
| E-3 | | | | | | | | 5.69 | |
| H-1 | 4.49 | 4.49 | 4.41 | 4.41 | 4.57 | 6.92 | 1.47 | 4.81 | |
| H-2 | | | | | | | | | 3.93 |
| Organopolysiloxane 1 | 0.20 | | | 0.20 | | 0.20 | 0.20 | 0.20 | 0.20 |
| Organopolysiloxane 4 | | | 0.20 | | | | | | |
| Oxidized polyethylene wax 1 | | 0.20 | 0.20 | | | 0.20 | 0.20 | 0.20 | 0.20 |
| Carnauba wax | | | | 0.20 | | | | | |
| Fused spherical silica | 88.00 | 88.00 | 88.00 | 88.00 | 88.00 | 82.00 | 95.00 | 88.00 | 88.00 |
| 1,2,4-Triazole-5-thiol (formula (3a)) | 0.10 | 0.10 | 0.10 | 0.10 | 0.10 | 0.10 | 0.10 | 0.10 | 0.10 |
| DBU | 0.20 | 0.20 | 0.20 | 0.20 | 0.20 | 0.20 | 0.20 | 0.20 | 0.20 |
| Coupling agent | 0.40 | 0.40 | 0.40 | 0.40 | 0.40 | 0.40 | 0.40 | 0.40 | 0.40 |
| Carbon black | 0.40 | 0.40 | 0.40 | 0.40 | 0.40 | 0.40 | 0.40 | 0.40 | 0.40 |
| Spiral flow (cm) | 105 | 100 | 90 | 100 | 110 | 140 | 60 | 85 | 90 |
| Flame resistance (UL-94) | V-0 | V-0 | V-0 | V-0 | V-0 | V-1 | V-0 | V-1 | V-1 |
| Continuous moldability | X | ○ | ○ | X | X | ○ | ◎ | ◎ | ◎ |
| Soiling of appearance of molded article and mold | ○ | X | X | ○ | X | ◎ | ◎ | ◎ | ◎ |
| Solder reflow resistance Chip delamination rate (%) | 10 | 0 | 0 | 10 | 30 | 50 | failure in filling | 20 | 30 |
| Inner lead portion delamination rate (%) | 0 | 10 | 0 | 10 | 20 | 50 | failure in filling | 40 | 40 |

Example Series (3)

Example (3)-1

The following components were mixed with each other by means of a mixer, and thereafter the mixture was mixed and kneaded by means of two rolls having a surface temperature of 95° C. and 25° C. respectively. Then, the mixture was cooled and grinded to obtain an epoxy resin composition. Properties of the obtained epoxy resin composition were evaluated in the following manner. The evaluation results are shown in Table 7.

Epoxy resin 1: an epoxy resin represented by the following formula (1a) (softening point 44° C., epoxy equivalent 234) 6.42 parts by weight Formula (1a)

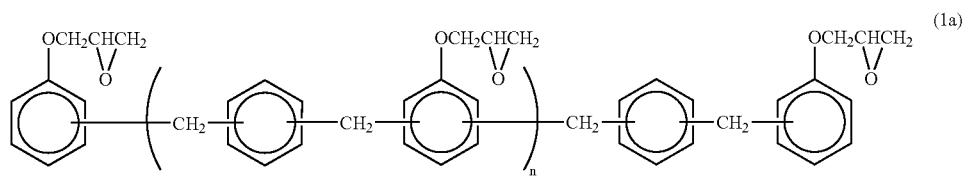

Phenolic resin 1: a phenolic resin represented by the following formula (2a) (softening point 107° C., hydroxyl group equivalent 198) 4.28 parts by weight Formula (2a)

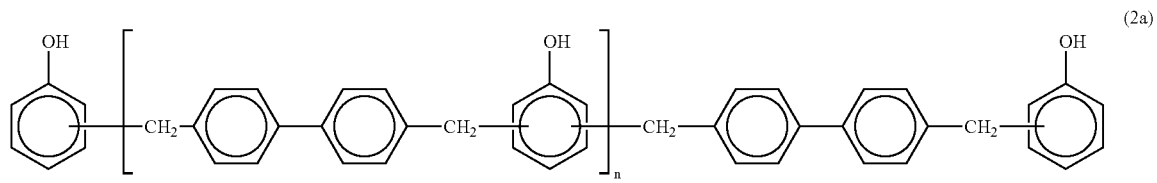

Curing accelerator 1: a curing accelerator represented by the following formula (5a) 0.20 parts by weight Formula (5a)

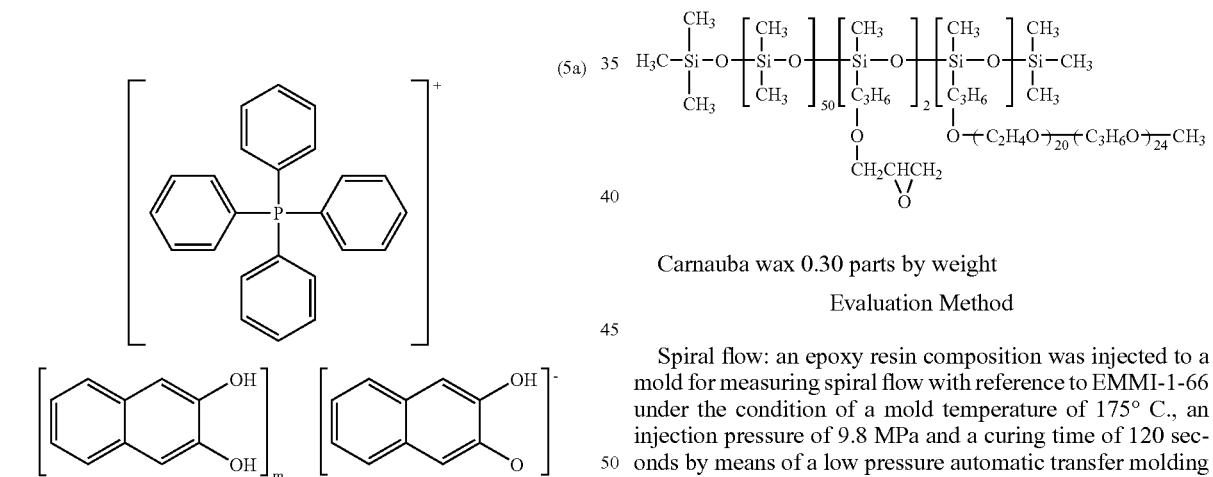

wherein, M=1.

| Silane coupling agent 1: γ-mercaptotripropylmethoxysilane | 0.20 parts by weight |
|---|---|
| Fusible spherical silica (mean particle diameter 25 μm) | 88.00 parts by weight |
| Carbon black | 0.40 parts by weight |
| Silicone oil: organopolysiloxane represented by the following formula (8) | 0.20 parts by weight |

Formula (8)

$$H_3C-\underset{\underset{CH_3}{|}}{\overset{\overset{CH_3}{|}}{Si}}-O-\left[\underset{\underset{CH_3}{|}}{\overset{\overset{CH_3}{|}}{Si}}-O\right]_{50}\left[\underset{\underset{C_3H_6}{|}}{\overset{\overset{CH_3}{|}}{Si}}-O\right]\left[\underset{\underset{C_3H_6}{|}}{\overset{\overset{CH_3}{|}}{Si}}-O\right]_{2}\underset{\underset{CH_3}{|}}{\overset{\overset{CH_3}{|}}{Si}}-CH_3 \quad (8)$$

with side groups $O-CH_2CHCH_2\overset{\diagdown}{\underset{O}{\diagup}}$ and $O-(C_2H_4O)_{20}(C_3H_6O)_{24}CH_3$ Carnauba wax 0.30 parts by weight Evaluation Method Spiral flow: an epoxy resin composition was injected to a mold for measuring spiral flow with reference to EMMI-1-66 under the condition of a mold temperature of 175° C., an injection pressure of 9.8 MPa and a curing time of 120 seconds by means of a low pressure automatic transfer molding machine to measure flow length. A measured unit was "cm". When the measured value is 80 cm or less, molding may be deteriorated such as deformation of a gold wire, unfilled package or the like.

Curability (gelation time): 30 g of an epoxy resin composition powder was placed on a heated plate of 175° C. and kneaded by means of a metal spatula to measure time for gelation. A general transfer molding takes about 50 seconds or more and 120 seconds or less. Hence, if gelation time is 45 seconds or more, molding may be deteriorated.

Flame resistance: a test sample with the size of 127 mm×12.7 mm×1.6 mm was molded under the condition of a mold temperature of 175° C., an injection pressure of 9.8 MPa and a curing time of 120 seconds by means of a transfer molding machine, and subject to post baking at 175° C. for 8 hours. Then, ΣF and Fmax were measured with reference to the UL-94 vertical method to assess flame resistance.

Solder reflow resistance: 80 pQFP (Copper frame: 14 mm×20 mm×thickness 2 mm, pad size: 8 mm×8 mm, chip size: 7 mm×7 mm) was molded to encapsulate with the use of a encapsulating resin mentioned in Examples and Comparative examples under the condition of a mold temperature of 175° C., an injection pressure of 9.6 MPa and a curing time of 90 seconds by means of a low pressure automatic transfer molding machine, and subject to the post curing process at 175° C. for 4 hours. 16 samples thus produced were separated into two groups, and one group and the other group were subject to a moisture absorption treatment for 168 hours in an atmosphere of 85° C. and 60% relative humidity and for 168 hours in an atmosphere of 85° C. and 85% relative humidity respectively, then each 16 samples were subject to an IR reflow process (260° C.) for 10 seconds. The obtained packages were observed by means of the scanning acoustic microscope detector to find presence of inner cracking and delamination at various interfaces. When at least one inner cracking or delamination at various interfaces was found, the package was evaluated as a defective product and the number of defective packages (n) is represented as "n/16".

Examples (3)-2 to (3)-10

Comparative Examples (3)-1 to (3)-8

According to the compounding amount in Tables 7 and 8, an epoxy resin composition was obtained in the manner similarly to Example (3)-1 and evaluation was performed in the manner similarly to Example (3)-1. The evaluation results are shown in Tables 7 and 8.

The materials not used in Example (3)-1 are as follows.

Epoxy resin 2: an epoxy resin represented by the following formula (1a) (softening point 55° C., epoxy equivalent 236):

Formula (1a)

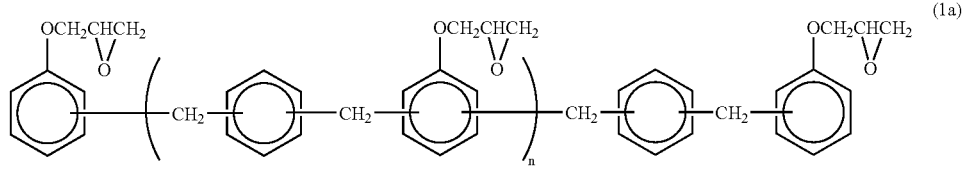

Epoxy resin 3: a biphenyl type epoxy resin YX-4000K (manufactured by Yuka Shell Epoxy K.K., epoxy equivalent 185, melting point 105° C.)

Epoxy resin 4: a bisphenol A type epoxy resin YL-6810 (manufactured by Japan Epoxy Resins Co., Ltd., epoxy equivalent 170 g/eq, melting point 47° C.)

Phenolic resin 2: a p-xylene-modified novolak type phenolic resin XLC-4L (manufactured by Mitsui Chemicals, Inc., hydroxyl group equivalent 168, softening point 62° C.)

Curing accelerator 2: triphenyl phosphine

Silane coupling agent 2: N-phenyl-γ-aminopropyl trimethoxysilane

Silane coupling agent 3: γ-glycidylpropyl trimethoxysilane

TABLE 7

| | Example | | | | | | | | | |
|---|---|---|---|---|---|---|---|---|---|---|
| | (3)-1 | (3)-2 | (3)-3 | (3)-4 | (3)-5 | (3)-6 | (3)-7 | (3)-8 | (3)-9 | (3)-10 |
| Epoxy resin 1 | 6.42 | | 4.20 | 4.12 | 6.58 | 6.38 | 6.42 | 6.42 | 8.15 | 5.26 |
| Epoxy resin 2 | | 6.44 | | | | | | | | |
| Epoxy resin 3 | | | 2.00 | | | | | | | |
| Epoxy resin 4 | | | | 2.00 | | | | | | |
| Phenolic resin 1 | 4.28 | 4.26 | 4.50 | 4.58 | 2.62 | 4.32 | 4.28 | 4.28 | 5.34 | 3.52 |
| Phenolic resin 2 | | | | | 1.50 | | | | | |
| Curing accelerator 1 | 0.20 | 0.20 | 0.20 | 0.20 | 0.20 | 0.15 | 0.20 | 0.20 | 0.35 | 0.16 |
| Curing accelerator 2 | | | | | | 0.05 | | | | |
| Silane coupling agent 1 | 0.20 | 0.20 | 0.20 | 0.20 | 0.20 | 0.20 | | | 0.26 | 0.16 |
| Silane coupling agent 2 | | | | | | | 0.20 | | | |
| Silane coupling agent 3 | | | | | | | | 0.20 | | |
| Fused spherical silica | 88.00 | 88.00 | 88.00 | 88.00 | 88.00 | 88.00 | 88.00 | 88.00 | 85.00 | 90.00 |
| Carbon black | 0.40 | 0.40 | 0.40 | 0.40 | 0.40 | 0.40 | 0.40 | 0.40 | 0.40 | 0.40 |
| Silicone oil | 0.20 | 0.20 | 0.20 | 0.20 | 0.20 | 0.20 | 0.20 | 0.20 | 0.20 | 0.20 |
| Carnauba wax | 0.30 | 0.30 | 0.30 | 0.30 | 0.30 | 0.30 | 0.30 | 0.30 | 0.30 | 0.30 |
| Spiral flow [cm] | 115 | 95 | 120 | 120 | 110 | 85 | 115 | 115 | 140 | 83 |
| Gelation time [sec] | 35 | 37 | 38 | 35 | 33 | 32 | 36 | 35 | 38 | 36 |
| Flame resistance (3.2 mm thickness) | V-0 | V-0 | V-0 | V-0 | V-0 | V-0 | V-0 | V-0 | V-0 | V-0 |

TABLE 7-continued

|  |  | Example | | | | | | | | | |
|---|---|---|---|---|---|---|---|---|---|---|---|
|  |  | (3)-1 | (3)-2 | (3)-3 | (3)-4 | (3)-5 | (3)-6 | (3)-7 | (3)-8 | (3)-9 | (3)-10 |
| Solder reflow resistance | Crack | 0/16 | 0/16 | 0/16 | 0/16 | 0/16 | 0/16 | 0/16 | 0/16 | 0/16 | 0/16 |
|  | Delamination on chip | 0/16 | 0/16 | 0/16 | 0/16 | 0/16 | 0/16 | 0/16 | 0/16 | 0/16 | 0/16 |
|  | Delamination on pad | 0/16 | 0/16 | 0/16 | 0/16 | 0/16 | 0/16 | 0/16 | 0/16 | 0/16 | 0/16 |
|  | Delamination on the back of pad | 0/16 | 0/16 | 0/16 | 0/16 | 0/16 | 0/16 | 0/16 | 0/16 | 0/16 | 0/16 |
|  | Delamination of inner lead | 0/16 | 0/16 | 0/16 | 0/16 | 0/16 | 0/16 | 2/16 | 4/16 | 4/16 | 0/16 |

TABLE 8

|  | Comparative Example | | | | | | | |
|---|---|---|---|---|---|---|---|---|
|  | (3)-1 | (3)-2 | (3)-3 | (3)-4 | (3)-5 | (3)-6 | (3)-7 | (3)-8 |
| Epoxy resin 1 |  |  | 6.83 | 6.30 | 6.35 | 6.54 | 10.52 | 3.47 |
| Epoxy resin 3 | 5.78 |  |  |  |  |  |  |  |
| Epoxy resin 4 |  | 5.58 |  |  |  |  |  |  |
| Phenolic resin 1 | 4.92 | 5.12 |  | 4.45 | 4.47 | 4.36 | 7.08 | 2.33 |
| Phenolic resin 2 |  |  | 3.87 |  |  |  |  |  |
| Curing accelerator 1 | 0.20 | 0.20 | 0.20 |  |  | 0.20 | 0.30 | 0.10 |
| Curing accelerator 2 |  |  |  | 0.15 | 0.08 |  |  |  |
| Silane coupling agent 1 | 0.20 | 0.20 | 0.20 | 0.20 | 0.20 |  | 0.20 | 0.20 |
| Fused spherical silica | 88.00 | 88.00 | 88.00 | 88.00 | 88.00 | 88.00 | 81.00 | 93.00 |
| Carbon black | 0.40 | 0.40 | 0.40 | 0.40 | 0.40 | 0.40 | 0.40 | 0.40 |
| Silicone oil | 0.20 | 0.20 | 0.20 | 0.20 | 0.20 | 0.20 | 0.20 | 0.20 |
| Carnauba wax | 0.30 | 0.30 | 0.30 | 0.30 | 0.30 | 0.30 | 0.30 | 0.30 |
| Spiral flow [cm] | 169 | 164 | 92 | 75 | 120 | 77 | 135 | 35 |
| Gelation time [sec] | 60 | 55 | 30 | 27 | 49 | 36 | 40 | 36 |
| Flame resistance (3.2 mm thickness) | V-1 | V-1 | V-1 | V-0 | V-0 | V-0 | burned out | V-0 |
| Solder reflow resistance | Crack | 0/16 | 0/16 | 0/16 | 0/16 | 0/16 | 0/16 | 16/16 | unable to mold |
|  | Delamination on chip | 0/16 | 0/16 | 0/16 | 0/16 | 0/16 | 0/16 | 16/16 | unable to mold |
|  | Delamination on pad | 0/16 | 16/16 | 16/16 | 12/16 | 12/16 | 16/16 | 16/16 | unable to mold |
|  | Delamination on the back of pad | 0/16 | 16/16 | 16/16 | 16/16 | 16/16 | 16/16 | 16/16 | unable to mold |
|  | Delamination of inner lead | 0/16 | 0/16 | 16/16 | 16/16 | 5/16 | 16/16 | 16/16 | unable to mold |

What is claimed is:

1. An epoxy resin composition for encapsulating a semiconductor essentially comprising (A) an epoxy resin represented by the following formula (1), (B) a phenolic resin represented by the following formula (2), (C) a curing accelerator, (D) an inorganic filler and (E) a triazole compound having a mercapto group, wherein (D) the inorganic filler is present in an amount of 84 wt % to 92 wt % based on the total amount of the epoxy resin composition; and wherein (E) the triazole compound is present in an amount of 0.01 to 2 wt % based on the total amount of the epoxy resin composition:

Formula (1)

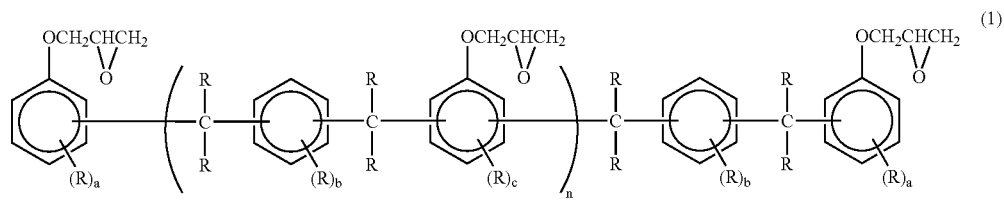

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less;

Formula (2)

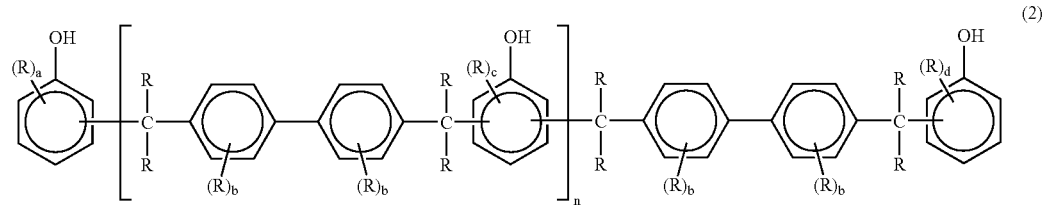

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less.

2. An epoxy resin composition for encapsulating a semiconductor according to claim 1, wherein a softening point of (A) the epoxy resin represented by formula (1) is 35° C. or more and 60° C. or less.

3. An epoxy resin composition for encapsulating a semiconductor according to claim 1, wherein (E) the triazole compound is a compound having a 1,2,4-triazole ring.

4. An epoxy resin composition for encapsulating a semiconductor according to claim 1, wherein (E) the triazole compound is a compound represented by the following formula (3):

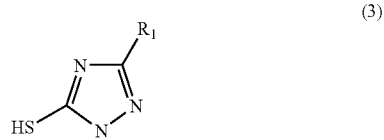

wherein $R_1$ is a hydrogen atom, or a functional group selected from the group consisting of a mercapto group, an amino group and a hydroxyl group, or a hydrocarbon chain having 1 to 5 carbons to which any one of the functional groups is added.

5. An epoxy resin composition for encapsulating a semiconductor according to claim 1, wherein a resin obtained by preliminary melting and mixing (A) the epoxy resin represented by the formula (1) and (B) the phenolic resin represented by the formula (2) is used.

6. A semiconductor device, wherein a semiconductor element is encapsulated with the epoxy resin composition for encapsulating a semiconductor defined by claim 1.

7. An epoxy resin composition for encapsulating a semiconductor according to claim 1, wherein (D) inorganic filler is one or more kinds of inorganic filler selected from the group consisting of fused silica, crystalline silica, secondary aggregated silica, alumina, titanium white and glass fiber.

8. An epoxy resin composition for encapsulating a semiconductor essentially comprising (A) an epoxy resin represented by the following formula (1), (B) a phenolic resin represented by the following formula (2), (H) a curing accelerator represented by the following formula (5), (I) a silane coupling agent and (D) an inorganic filler which consists of a member selected from the group consisting of fused silica, crystalline silica, secondary aggregated silica, alumina, titanium white, glass fiber, and mixtures thereof, wherein (H) the curing accelerator represented by the formula (5) is present in an amount of 0.05 wt % to 0.5 wt % and (D) the inorganic filler is present in an amount of 84 wt % to 92 wt % based on the total amount of the epoxy resin composition:

Formula (1)

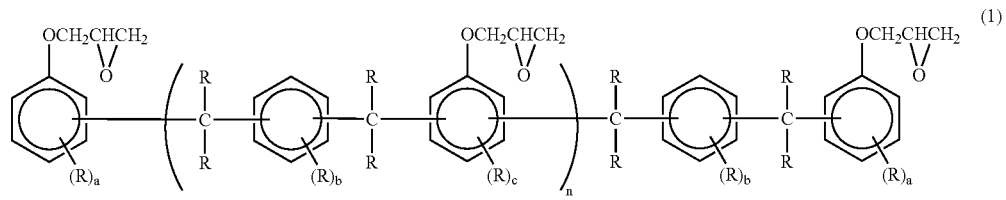

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less;

Formula (2)

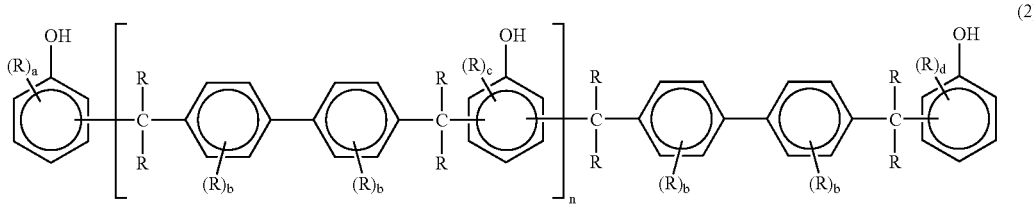

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less;

Formula (5)

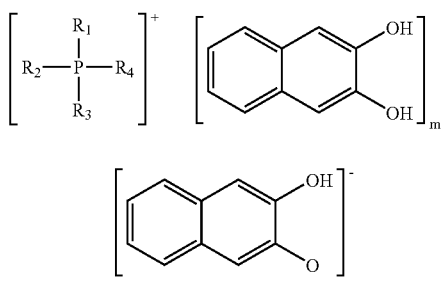

wherein P is a phosphorus atom; each of $R_1$ to $R_4$ is an organic group having 6 to 20 carbons containing an aromatic ring or an aliphatic hydrocarbon group having 1 to 20 carbons, which may be the same or different from each other; and "m" is a number of $0 \leqq m \leqq 2$.

9. An epoxy resin composition for encapsulating a semiconductor according to claim 8, wherein a softening point of (A) the epoxy resin represented by formula (1) is 35° C. or more and 60° C. or less.

10. A semiconductor device, wherein a semiconductor element is encapsulated with the epoxy resin composition for encapsulating a semiconductor defined by claim 8.

11. An epoxy resin composition for encapsulating a semiconductor essentially comprising (A) an epoxy resin represented by the following formula (1), (B) a phenolic resin represented by the following formula (2), (E) a triazole compound having a mercapto group, (F) organopolysiloxane having a carboxyl group, (C) oxidized polyethylene and (D) one or more kinds of inorganic fillers selected from the group consisting of fused silica, crystalline silica, secondary aggregated silica, alumina, titanium white, and glass fiber, wherein (D) the inorganic filler is present in an amount of 84 wt % to 92 wt % based on the total amount of the epoxy resin composition; and wherein (E) the triazole compound is present in an amount of 0.01 to 2 wt % based on the total amount of the epoxy resin composition:

Formula (1)

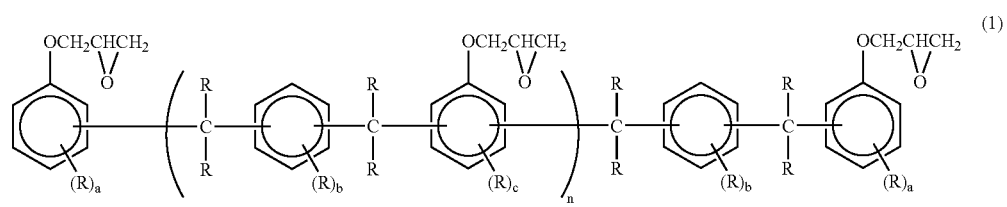

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less;

Formula (2)

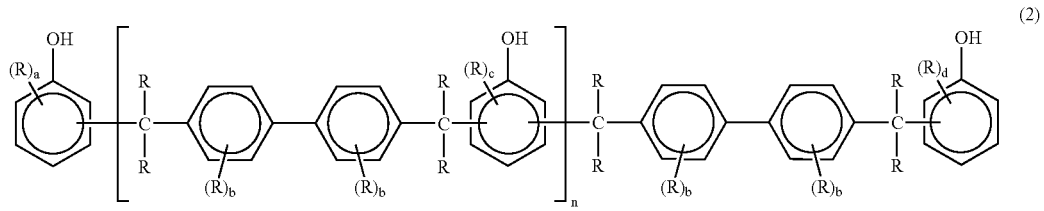

wherein R is hydrogen or an alkyl group having 1 to 4 carbons, which may be the same or different from each other; "a" is an integer of 0 to 4; "b" is an integer of 0 to 4; "c" is an integer of 0 to 3; "d" is an integer of 0 to 4; and "n" is a mean value and 0 or a positive number of 10 or less.

12. An epoxy resin composition for encapsulating a semiconductor according to claim 11, wherein a softening point of (A) the epoxy resin represented by the formula (1) is 35° C. or more and 60° C. or less.

13. An epoxy resin composition for encapsulating a semiconductor according to claim 11, wherein (F) the organopolysiloxane having a carboxyl group is organopolysiloxane represented by the following formula (4):
Formula (4)

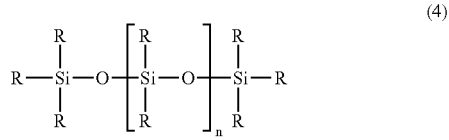

(4)

wherein at least one or more of R is an organic group having 1 to 40 carbons and having a carboxyl group and the other group of R is a group selected from the group consisting of hydrogen, a phenyl group and a methyl group, which may be the same or different from each other; and "n" is a mean value and a positive number of 1 to 50.

14. An epoxy resin composition for encapsulating a semiconductor according to claim 11, wherein (G) oxidized polyethylene is obtained by oxidizing high density polyethylene.

15. An epoxy resin composition for encapsulating a semiconductor according to claim 11, wherein (G) oxidized polyethylene has a maximum particle diameter of 150 μm or less, and a mean particle diameter of 0.1 μm or more and 100 μm or less.

16. An epoxy resin composition for encapsulating a semiconductor according to claim 11, wherein (G) oxidized polyethylene has a dropping point of 100° C. or more and 130° C. or less.

17. An epoxy resin composition for encapsulating a semiconductor according to claim 11, wherein organopolysiloxane having a carboxyl group which is preliminarily reacted with the epoxy resin and a curing accelerator is contained as (F) organopolysiloxane having a carboxyl group.

18. An epoxy resin composition for encapsulating a semiconductor according to claim 11, wherein a weight ratio (F)/(G) of (F) organopolysiloxane having a carboxyl group and (G) oxidized polyethylene is 5/1 to 1/5.

19. An epoxy resin composition for encapsulating a semiconductor according to claim 11, further comprising (E) a triazole compound.

20. An epoxy resin composition for encapsulating a semiconductor according to claim 19, wherein (E) the triazole compound is a compound having a 1,2,4-triazole ring.

21. An epoxy resin composition for encapsulating a semiconductor according to claim 19, wherein (E) the triazole compound is a compound represented by the following formula (3):
Formula (3)

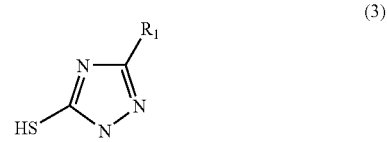

(3)

wherein $R_1$ is a hydrogen atom, or a functional group selected from the group consisting of a mercapto group, an amino group and a hydroxyl group, or a hydrocarbon chain having 1 to 5 carbons to which any one of the functional groups is added.

22. An epoxy resin composition for encapsulating a semiconductor according to claim 11, wherein a resin obtained by preliminary melting and mixing (A) the epoxy resin represented by the formula (1) and (B) the phenolic resin represented by the formula (2) is used.

23. A semiconductor device, wherein a semiconductor element is encapsulated with the epoxy resin composition for encapsulating a semiconductor defined by claim 11.

24. An epoxy resin composition for encapsulating a semiconductor according to claim 11, wherein (F) the organopolysiloxane having a carboxyl group is organopolysiloxane represented by the following formula (4):
Formula (4)

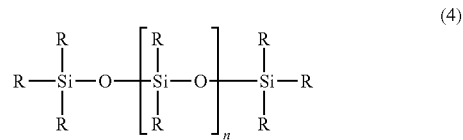

(4)

wherein at least one or more of R is an organic group having 1 to 40 carbons and having a carboxyl group and the other group of R is a group selected from the group consisting of hydrogen and a methyl group, which may be the same or different from each other; and "n" is a mean value and a positive number of 1 to 50.

* * * * *